United States Patent
Lee et al.

(10) Patent No.: US 12,477,878 B2
(45) Date of Patent: Nov. 18, 2025

(54) DISPLAY DEVICE

(71) Applicant: Samsung Display Co., Ltd., Yongin-Si (KR)

(72) Inventors: Junhyun Lee, Yongin-si (KR); Dong-Ho Kim, Yongin-si (KR); Haegoo Jung, Yongin-si (KR); Jooho Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 405 days.

(21) Appl. No.: 18/139,848

(22) Filed: Apr. 26, 2023

(65) Prior Publication Data
US 2024/0072224 A1    Feb. 29, 2024

(30) Foreign Application Priority Data
Aug. 26, 2022   (KR) .................. 10-2022-0107365

(51) Int. Cl.
*H10D 86/40*   (2025.01)
*H01L 25/16*   (2023.01)
(Continued)

(52) U.S. Cl.
CPC .......... *H10H 20/857* (2025.01); *H01L 25/167* (2013.01); *H10D 86/441* (2025.01); *H10D 86/60* (2025.01)

(58) Field of Classification Search
CPC .... H10D 86/60; H10D 86/441; H10K 59/131; H10K 59/1213; H10K 71/70
See application file for complete search history.

(56) References Cited

U.S. PATENT DOCUMENTS 8,362,483 B2    1/2013  Kim
2019/0027076 A1  1/2019  Lee et al.
(Continued)

FOREIGN PATENT DOCUMENTS

KR         10-1659239 B1   9/2016
KR     10-2017-0076189 A   7/2017
(Continued)

OTHER PUBLICATIONS

PCT/KR2023/011523, PCT-Search-Report dated on Nov. 13, 2023, 3 pages.

*Primary Examiner* — Joseph L Williams
(74) *Attorney, Agent, or Firm* — Innovation Counsel LLP

(57) ABSTRACT

A display device includes: a substrate including a display area and a non-display area positioned around the display area and including a pad area adjacent to one side of the display area, a light emitting element disposed in the display area on the substrate, a pad portion disposed in the pad area on the substrate and including a plurality of output pads, a driving chip, and a control signal line. The driving chip includes a base portion facing the substrate, overlapping the pad area, and including dummy bump areas, an output bump area positioned between the dummy bump areas, and a data output area positioned between the dummy bump areas, a plurality of dummy bumps attached to a lower surface of the base portion and overlapping the dummy bump areas and the output bump area, respectively, a plurality of output bumps attached to the lower surface of the base portion, overlapping the output bump area, and connected in parallel to each other through transistors, and a plurality of detection bumps attached to the lower surface of the base portion, each of the detection bumps is electrically connected to the output bumps and overlapping the output bump area. The control (Continued)

signal line electrically connected through the transistors to the output bumps.

26 Claims, 18 Drawing Sheets

(51) Int. Cl.
    *H10D 86/60*        (2025.01)
    *H10H 20/857*     (2025.01)
    *H10K 59/12*       (2023.01)
    *H10K 59/131*     (2023.01)

(56) References Cited

U.S. PATENT DOCUMENTS

| | | | |
|---|---|---|---|
| 2021/0249500 A1 | 8/2021 | Lee et al. | |
| 2021/0383730 A1 | 12/2021 | Kim et al. | |
| 2021/0407957 A1* | 12/2021 | Kim | H01L 24/17 |
| 2022/0013048 A1* | 1/2022 | Kim | G09G 3/006 |
| 2025/0098308 A1* | 3/2025 | Kang | G09G 3/2092 |

FOREIGN PATENT DOCUMENTS

| | | |
|---|---|---|
| KR | 10-2021-0103040 A | 8/2021 |
| KR | 10-2021-0150649 A | 12/2021 |
| KR | 10-2351977 B1 | 1/2022 |

\* cited by examiner

DISPLAY DEVICE

CROSS-REFERENCE TO RELATED APPLICATION

This application claims priority from and the benefit of Korean Patent Application No. 10-2022-0107365, filed on Aug. 26, 2022, which is hereby incorporated by reference for all purposes as if fully set forth herein.

BACKGROUND

1. Field

The present disclosure relates to display devices.

2. Description of the Related Art

As information technology develops, the importance of display devices, which are communication media between users and information, is being highlighted. Accordingly, the use of display devices such as a liquid crystal display device, an organic light emitting display device, a plasma display device, and the like is increasing.

SUMMARY

Embodiments of the present disclosure may provide a display device with reduced defects through redundancy.

An embodiment of a display device of the present disclosure may include a substrate including a display area and a non-display area positioned around the display area and including a pad area adjacent to one side of the display area, a light emitting element disposed in the display area on the substrate, a pad portion disposed in the pad area on the substrate and including a plurality of output pads, a driving chip, and a control signal line. The driving chip may include a base portion facing the substrate, overlapping the pad area, and including dummy bump areas, an output bump area positioned between the dummy bump areas, and a data output area positioned between the dummy bump areas, a plurality of dummy bumps attached to a lower surface of the base portion and overlapping the dummy bump areas and the output bump area, respectively, a plurality of output bumps attached to the lower surface of the base portion, overlapping the output bump area, and connected in parallel to each other through transistors, and a plurality of detection bumps attached to the lower surface of the base portion, each of the detection bumps is electrically connected to an output bump from among the output bumps, and overlapping the output bump area. The control signal line may be electrically connected through the transistors to the output bumps.

In an embodiment, the control signal line may be electrically connected to the output bump positioned in a first row. The display device may further include a first connection line electrically connecting to the first output bump positioned in a second row adjacent to the first row and a second connection line electrically connecting to the output bump positioned in a third row adjacent to the second row.

In an embodiment, the display device wherein the transistors may include a first transistor disposed in the non-display area and connected to the control signal line, a second transistor disposed in the non-display area and connected to the first connection line, and a third transistor disposed in the non-display area and connected to the second connection line.

In an embodiment, each of the first, second, and third transistors may be switching transistor.

In an embodiment, the control signal line, the first connection line, and the second connection line may be disposed on a same layer.

In an embodiment, in the output bump area, the dummy bumps may be disposed in a n-th column (where, the n is a natural number), the detection bumps may be disposed in an (n+1)-th column adjacent to the n-th column, and the output bumps may be disposed in an (n+2)-th column adjacent to the (n+1)-th column.

In an embodiment, each of the dummy bumps, the detection bumps, and the output bumps may be disposed in three rows.

In an embodiment, the number of the dummy bumps in the output bump area may be greater than the number of the detection bumps and greater than the number of the output bumps.

In an embodiment, in the output bump area, the detection bumps may be disposed in a (5n−4)-th column and a (5n−1)-th column of each of a first row and a second row adjacent to the first row (where the n is a natural number), the dummy bumps may be disposed in a 5n-th column of each of the first row and the second row and a third row adjacent to the second row, and the output bumps may be disposed in a (5n−3)-th column and in a (5n−2)-th column of each of the first row and the second row.

In an embodiment, in the output bump area, the detection bumps may be disposed in a (5n−4)-th column and a (5n−1)-th column of a first row and a (5n−3)-th column and a (5n−2)-th column of a third row (where the n is a natural number), the dummy bumps may be disposed in a 5n-th column of the first row, a (5n−4)-th column, a (5n−1)-th column, and a 5n-th column of each of a second row adjacent to the first row and the third row, and the output bumps may be disposed in a (5n−3)-th column and a (5n−2)-th column of each of the first row and the second row.

In an embodiment, in the output bump area, the detection bumps may be disposed in a (5n−4)-th column and a (5n−1)-th column of each of a first row and a second row adjacent to the first row (where the n is a natural number), the dummy bumps may be disposed in a 5n-th column of each of the first row and the second row, and the output bumps may be disposed in a (5n−3)-th column and a (5n−2)-th column of each of the first row and the second row.

In an embodiment, in the output bump area, the detection bumps may be disposed in a (5n−4)-th column and a (5n−1)-th column of a first row (where the n is a natural number), the dummy bumps may be disposed in a 5n-th column and a second row adjacent to the first row, and the output bumps may be disposed in a (5n−3)-th column and a (5n−2)-th column of first row.

In an embodiment, in the output bump area, the detection bumps may be disposed in a (5n−3)-th column and a (5n−2)-th column of a second row (where the n is a natural number), the dummy bumps may be disposed in a (5n−4)-th column, a (5n−1)-th column, and a 5n-th column of each of a first row adjacent to the second row and the second row, and the output bumps may be disposed in a (5n−3)-th column and a (5n−2)-th column of the second row.

In an embodiment, in the output bump area, the detection bumps may be disposed in a (5n−2)-th column of each of a first row and a second row adjacent to the first row, the dummy bumps may be disposed in a (5n−4)-th column, a (5n−1)-th column, and a 5n-th column of each of the first row and the second row, and the output bumps may be disposed in a (5n−3)-th column of each of the first row and the second row.

In an embodiment, a high voltage may be applied to each of the dummy bumps.

In an embodiment, each of the dummy bumps may be in a floating state, or a ground voltage may be applied to each of the dummy bumps.

In an embodiment, the display device may further include a plurality of second output bumps attached to the lower surface of the base portion, overlapping the data output area, and to which a data voltage is applied.

In an embodiment, the display device may further include a fan-out line electrically connected to each of the second output bumps and providing the data voltage to the light emitting element.

In an embodiment, a control signal may be applied to some output bumps among the output bumps, and other first output bumps among the first output bumps are in a floating state.

In an embodiment, the detection pads may measure a waveform of the control signal applied to the output bumps.

In an embodiment, a voltage may be applied to some first output bumps among the output bumps, and other output bumps among the first output bumps are in a floating state.

In an embodiment, the detection pads may measure a level of the voltage applied to the first output pads.

In an embodiment, each of the first output bumps, the detection bumps and the dummy bumps may be disposed to correspond to each of the output pads.

An embodiment of a display device of the present disclosure may include a substrate including a display area and a pad area, a light emitting element disposed in the display area on the substrate, a pad portion disposed in the pad area on the substrate and including a plurality of output pads, a driving chip, and a control signal line. The driving chip may include a base portion facing the substrate and overlapping the pad area, a plurality of output bumps attached to a lower surface of the base portion, connected in parallel to each other through transistors, and to which a control signal or a voltage is applied to some of the output bumps, and a plurality of detection bumps attached to the lower surface of the base portion, each of the detection bumps is electrically connected to an output bump from among the output bumps and at least one of the detection bumps measures a waveform of the control signal or a level of the voltage. The control signal line may be electrically connected to the output bumps through the transistors.

In an embodiment, the control signal line may be electrically connected to each of the output bumps positioned in a first row. The display device may further include a first connection line electrically connecting the output bumps positioned in a second row adjacent to the first row and a second connection line electrically connecting each of the output bumps positioned in a third row adjacent to the second row.

In an embodiment, each of the output bumps may be disposed to correspond to each of the output pads, and each of the detection bumps may be disposed to correspond to each of the output pads.

In a display device according to an embodiment of the present disclosure, all output bumps of a driving chip to which a control signal or voltage is applied may be connected in parallel through connection lines and a control signal line. In addition, detection bumps electrically connected to the output bumps may detect whether the driving chip is defective by measuring a waveform of the control signal or a level of the voltage applied to the output bumps. Accordingly, when a defect in the driving chip occurs, the time at which the defect in the driving chip occurs may be delayed.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
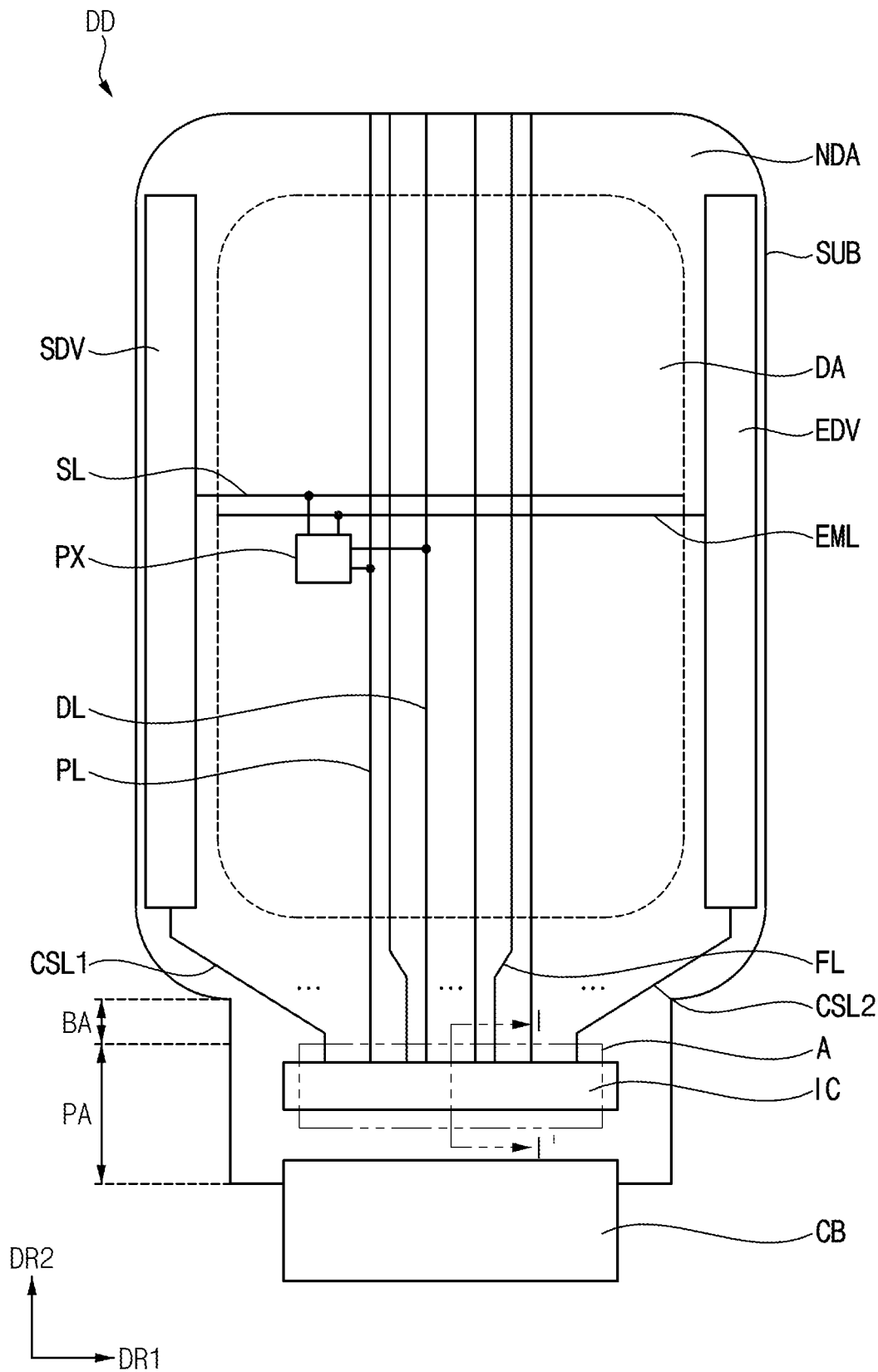
FIG. 1 is a plan view illustrating a display device according to an embodiment.

Hereinafter, a display device according to embodiments of the present disclosure will be explained in detail with reference to the accompanying drawings. The same reference numerals are used for the same components in the drawings, and redundant descriptions of the same components will be omitted.

Figure 2:
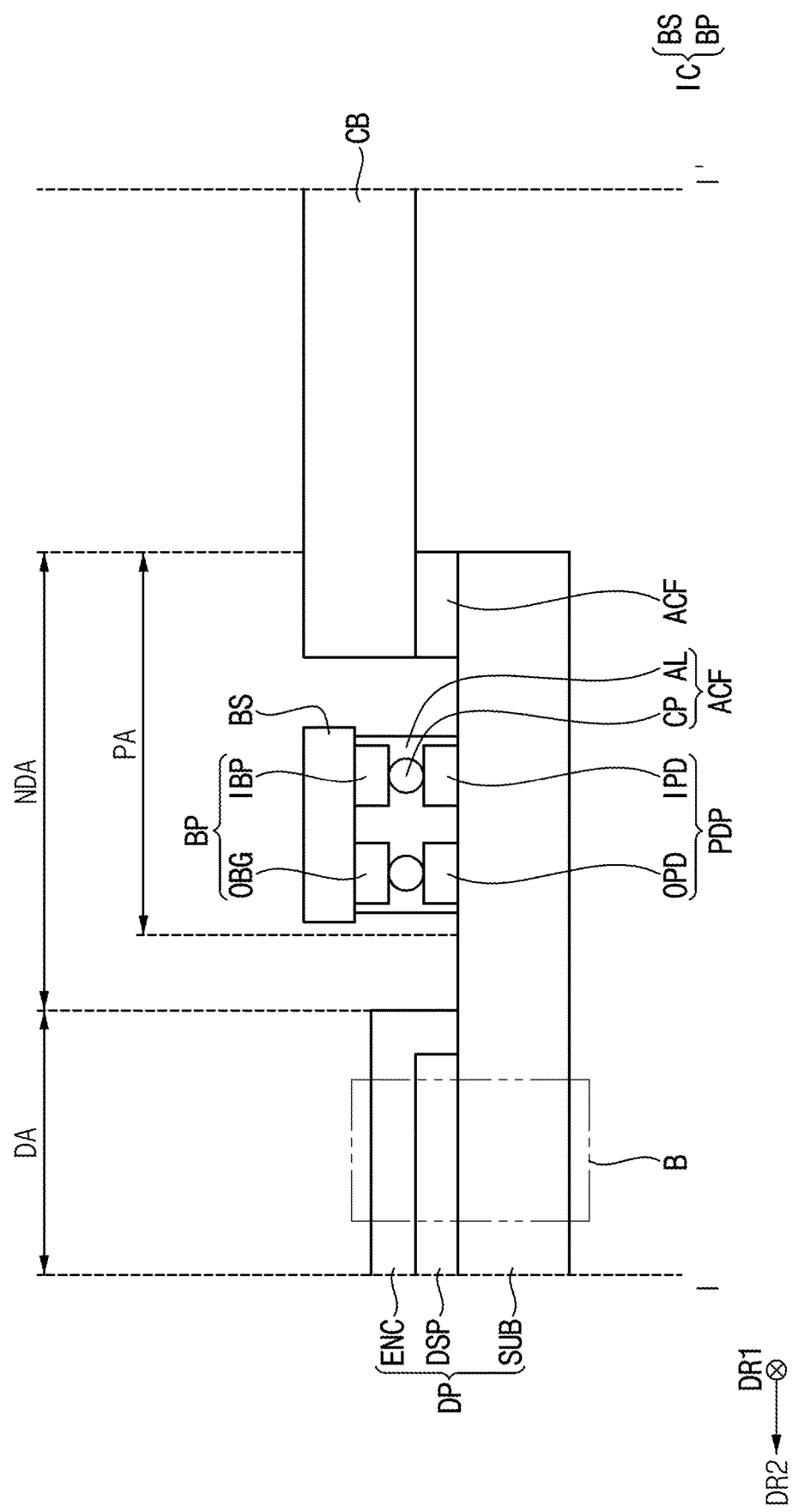
FIG. 2 is a cross-sectional view taken along line I-I' of FIG. 1.

FIG. 1 is a plan view illustrating a display device according to an embodiment. FIG. 2 is a cross-sectional view taken along line I-I' of FIG. 1.

Referring to FIGS. 1 and 2, a display device DD according to an embodiment may include a display panel DP, a pad portion PDP, a driving chip IC, a circuit board CB, and an anisotropic conductive film ACF.

The display panel DP may include a substrate SUB, a display portion DSP disposed in a display area DA on the substrate SUB, and an encapsulation layer ENC disposed on the display portion DSP and surrounding the display portion DSP. A detailed description of components of the display panel DP will be described later.

The substrate SUB may include the display area DA and a non-display area NDA. The non-display area NDA may be positioned around the display area DA. For example, the non-display area NDA may surround the display area DA or partially surround the display area DA.

The display area DA may be an area capable of displaying an image by generating light or adjusting transmittance of light provided from an external light source. The non-display area NDA may be an area not displaying an image.

The non-display area NDA may include a bending area BA and a pad area PA. The bending area BA may be positioned between the display area DA and the pad area PA when viewed from a plan view. A portion of the substrate SUB overlapping the bending area BA may be bent based on a bending axis extending in a first direction DR1. In addition, the pad area PA may have a shape extending along one side of the display device DD. For example, the pad area PA may have a shape extending along the first direction DR1 parallel to an upper surface of the substrate SUB.

A plurality of pixels PX may be arranged in the display area DA on the substrate SUB. Each of the pixels PX may include a driving element and a light emitting element electrically connected to the driving element. Each of the pixels PX may generate light according to a driving signal. The pixels PX may be entirely arranged in the display area DA in a matrix form. The pixels PX may be components included in the display portion DSP.

Drivers for driving the pixels PX may be disposed in the non-display area NDA on the substrate SUB. For example, a scan driver SDV, a light emitting driver EDV, and the driving chip IC may be disposed in the non-display area NDA on the substrate SUB.

A data line DL, a scan line SL, a light emitting control line EML, and a driving voltage line PL connected to the pixels PX may be disposed in the display area DA on the substrate SUB. In addition, a first control signal line CSL1 connected to the scan driver SDV, a second control signal line CSL2 connected to the light emitting driver EDV, and a fan-out line FL connected to the pixels PX may be disposed in the non-display area NDA on the substrate SUB, The scan line SL may be electrically connected to the scan driver SDV and may extend along the first direction DR1. The scan line SL may receive a scan signal from the scan driver SDV and provide the scan signal to the pixels PX.

The light emitting control line EML may be electrically connected to the light emitting driver EDV and may extend along the first direction DR1. The light emitting control line EML may receive a light emitting signal from the light emitting driver EDV and provide the light emitting signal to the pixels PX. For example, an active period of the light emitting signal may be a light emitting period of the display device DD, and an inactive period of the light emitting signal may be a non-light emitting period of the display device DD.

The data line DL may be electrically connected to the driving chip IC through the fan-out line FL and may extend along a second direction DR2 crossing the first direction DR1. That is, the data line DL may be connected to the fan-out line FL. The fan-out line FL may be disposed in the non-display area NDA adjacent to an upper of the display area DA. The fan-out line FL may receive a data voltage from the driving chip IC and provide the data voltage to the data line DL. The data line DL may provide the data voltage to the pixels PX.

The driving voltage line PL may be electrically connected to the driving chip IC and may extend along the second direction DR2. The driving voltage line PL may receive a driving voltage from the driving chip IC and provide the driving voltage to the pixels PX. For example, the driving voltage may be a high power supply voltage for driving the pixels PX.

The first control signal line CSL1 may be electrically connected to the driving chip IC. The first control signal line CSL1 may receive a first control signal from the driving chip IC and provide the first control signal to the scan driver SDV.

The second control signal line CSL2 may be electrically connected to the driving chip IC. The second control signal line CSL2 may receive a second control signal from the driving chip IC and provide the second control signal to the light emitting driver EDV.

The driving chip IC may generate the first control signal, the second control signal, the driving voltage, and the data voltage. The scan driver SDV may receive the first control signal from the driving chip IC and generate the scan signal based on the first control signal. The light emitting driver EDV may receive the second control signal from the driving chip IC and generate the light emitting control signal based on the second control signal.

Figure 4:
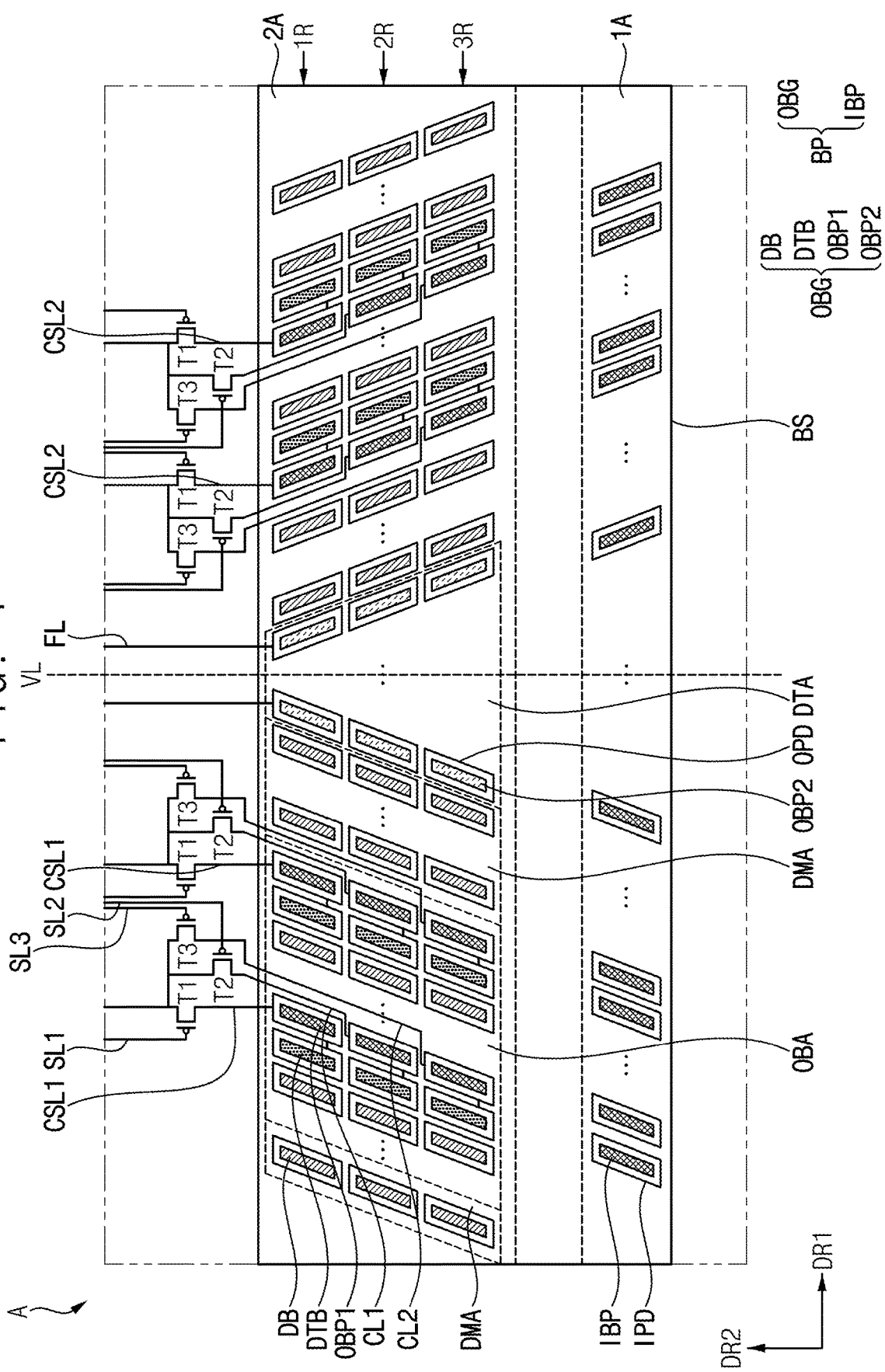
FIG. 4 is an enlarged plan view of an example of area A of FIG. 1.

The pad portion PDP may be disposed in the pad area PA on the substrate SUB. The pad portion PDP may include an input pad IPD and an output pad OPD. As illustrated in FIG. 4, a plurality of input pads IPD and output pads OPD may be provided. Each of the input pad IPD and the output pad OPD may include metal, a transparent conductive material, and the like. For example, each of the input pad IPD and the output pad OPD may include metal such as gold ("Au"), silver ("Ag"), aluminum ("Al"), copper ("Cu") and transparent conductive material such as indium tin oxide ("ITO"), indium zinc oxide ("IZO"), and indium zinc tin oxide ("IZTO"). These may be used alone or in combination with each other. In an embodiment, each of the input pad IPD and the output pad OPD may have a multilayer structure including ITO/Ag/ITO.

The input pad IPD may transfer a voltage, a control signal, and the like provided from the circuit board CB to the driving chip IC. That is, the voltage, control signal, and the like output from the circuit board CB may be provided to the driving chip IC through the input pad IPD.

The output pad OPD may receive a voltage, a control signal, and the like provided from the driving chip IC. That is, the voltages, the control signal, and the like output from the driving chip IC may be provided to the pixels PX, the scan driver SDV, and the light emitting driver EDV through the output pad OPD.

The driving chip IC may be disposed in the pad area PA on the substrate SUB. The driving chip IC may control signals and voltages provided to the pixels PX. In an embodiment, when the substrate SUB includes glass, the driving chip IC may have a chip on glass ("COG") structure directly disposed on the substrate SUB. In another embodiment, when the substrate SUB includes a transparent resin substrate, the driving chip IC may have a chip on plastic ("COP") structure directly disposed on the substrate SUB. However, the present disclosure is not limited thereto, and a flexible film is disposed in the pad area PA on the substrate SUB, and the driving chip IC may have a chip on film ("COF") structure directly disposed on the flexible film.

The driving chip IC may include a base portion BS facing the substrate SUB and a bump portion BP attached to a lower surface of the base part BS. The bump portion BP may include an input bump IBP and an output bump group OBG. As illustrated in FIG. 4, a plurality of input bumps IBP and output bump groups OBG may be provided. The input bump IBP may overlap the input pad IPD, and the output bump group OBG may overlap the output pad OPD. For example, each of the input bump IBP and the output bump group OBG may include a metal such as copper, gold, and the like. These may be used alone or in combination with each other. In addition, the base portion BS may include plastic such as polyimide.

The input bump IBP may receive a voltage, a control signal, and the like provided from the circuit board CB. In addition, the output bump group OBG may output the voltage provided to the pixels PX, the control signal provided to the scan driver SDV, and the control signal provided to the light emitting driver EDV.

The anisotropic conductive film ACF may be disposed in the pad area PA between the substrate SUB and the driving chip IC. The anisotropic conductive film ACF may bond the pad portion PDP and the driving chip IC. Due to this, the anisotropic conductive film ACF may electrically connect the substrate SUB and the driving chip IC. In an embodiment, the anisotropic conductive film ACF may include an adhesive layer AL and a plurality of conductive particles CP arranged in the adhesive layer AL.

The adhesive layer AL may include an insulating polymer material. For example, the adhesive layer AL may include an insulating polymer material such as an epoxy resin, an acrylic resin, a phenol resin, a melamine resin, a diallylphthalate resin, a urea resin, a polyimide resin, a polystyrene resin, a polyurethane resin, a polyethylene resin, a polyvinyl acetate resin, and the like. These may be used alone or in combination with each other.

The conductive particles CP may be disposed between the pad portion PDP and the bump portion BP. Specifically, the conductive particles CP may be disposed between the input pad IPD and the input bump IBP and between the output pad OPD and the output bump group OBG. Accordingly, the conductive particles CP may electrically connect the substrate SUB and the driving chip IC. In an embodiment, each of the conductive particles CP may include a core including an insulating polymer material and a conductive layer surrounding the core and including a conductive metal material.

The circuit board CB may be disposed in the pad area PA on the substrate SUB. Specifically, the circuit board CB may partially overlap the pad area PA. That is, a first portion of the circuit board CB may overlap the pad area PA, and a second portion of the circuit board CB excluding the first portion may not overlap the pad area PA. The circuit board CB may be bonded to the substrate SUB through the anisotropic conductive film ACF. Accordingly, the circuit board CB may be electrically connected to the display panel DP.

The pixels PX may receive voltages, control signals, and the like from the circuit board CB. In an embodiment, the circuit board CB may include a printed circuit board ("PCB"), a flexible printed circuit board ("FPCB") or a flexible flat cable ("FFC").

FIG. 1 illustrates that the scan driver SDV is disposed in the non-display area NDA adjacent to a left side of the display area DA, and the light emitting driver EDV is disposed in the non-display area NDA adjacent to a right side of the display area DA, but the present disclosure is not limited thereto. For example, each of the gate driver GDV and the light emitting driver EDV may be disposed at different positions in the non-display area NDA.

In this specification, a plane may be defined as the first direction DR1 and the second direction DR2 crossing the first direction DR1. For example, the second direction DR2 may be perpendicular to the first direction DR1.

Figure 3:
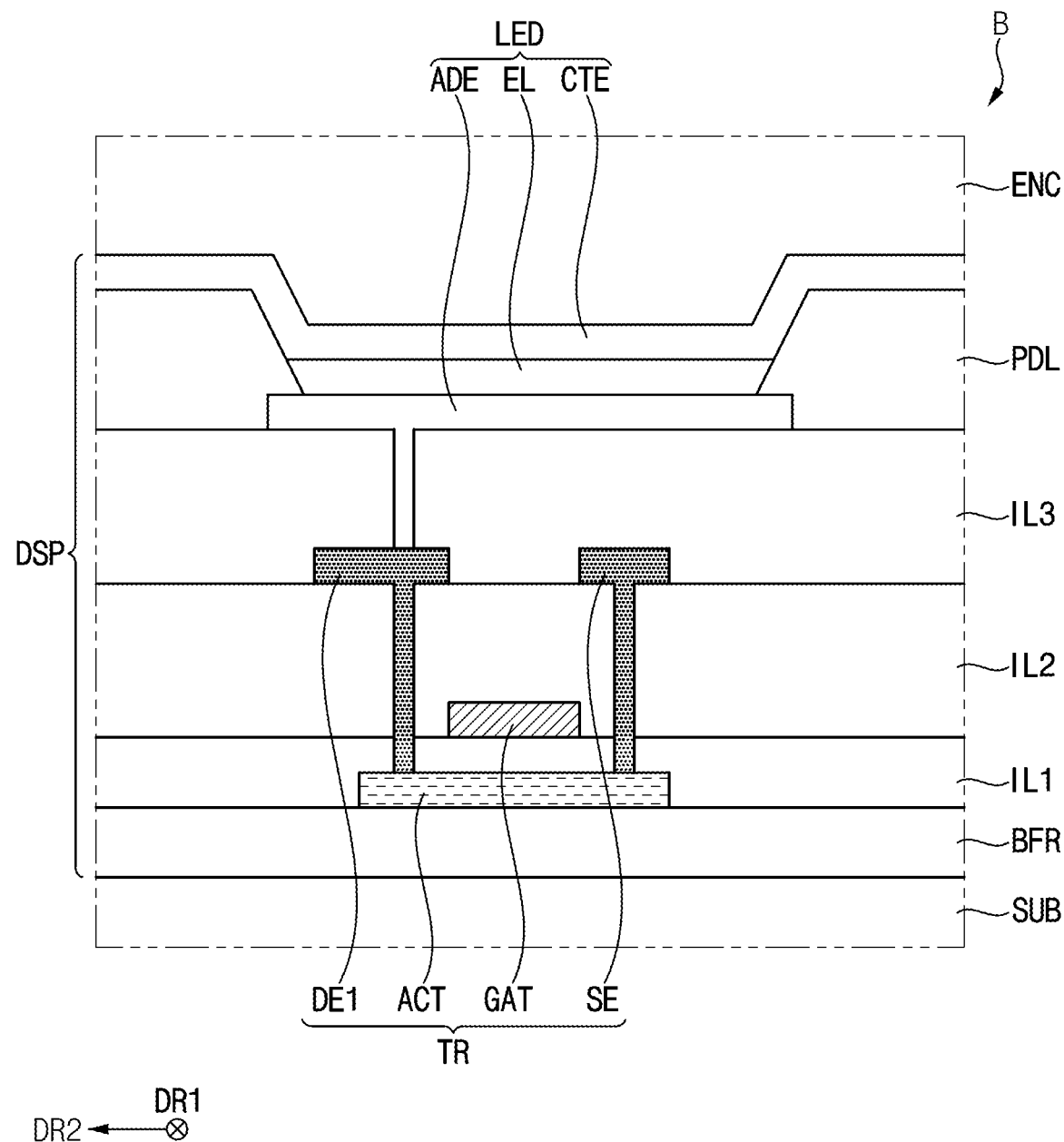
FIG. 3 is an enlarged cross-sectional view of area B of FIG. 2.

FIG. 3 is an enlarged cross-sectional view of area B of FIG. 2.

Referring to FIGS. 2 and 3, the display panel DP of the display device DD according to an embodiment may include the substrate SUB, the display portion DSP disposed on the substrate SUB, and the encapsulation layer ENC disposed on the display portion DSP. Here, the display portion DSP may include a buffer layer BUF, a transistor TR, a first insulating layer IL1, a second insulating layer IL2, a third insulating layer IL3, a pixel defining layer PDL, and a light emitting element LED. The transistor TR may include an active pattern ACT, a gate electrode GAT, a source electrode SE, and a drain electrode DE, and the light emitting element LED may include an anode electrode ADE, a light emitting layer EL, and a cathode electrode CTE.

The substrate SUB may include a transparent material or an opaque material. The substrate SUB may be made of a transparent resin substrate. An example of a transparent resin substrate that can be used as the substrate SUB may include a polyimide substrate. In this case, the polyimide substrate may include a first polyimide layer, a barrier film layer, and a second polyimide layer. In another embodiment, the substrate SUB may include a quartz substrate, a synthetic quartz substrate, a calcium fluoride substrate, an F-doped quartz substrate, soda-lime glass substrate, a non-alkali glass substrate, and the like. These may be used alone or in combination with each other.

The buffer layer BUF may be disposed on the substrate SUB. The buffer layer BUF may prevent diffusion of metal atoms or impurities from the substrate SUB into the transistor TR. In addition, the buffer layer BUF may improve flatness of the surface of the substrate SUB when the surface of the substrate SUB is not uniform. For example, the buffer layer BUF may include an inorganic material such as silicon oxide, silicon nitride, silicon oxynitride, and the like. These may be used alone or in combination with each other.

The active pattern ACT may be disposed on the buffer layer BUF. The active pattern ACT may include a metal oxide semiconductor, an inorganic semiconductor (e.g., amorphous silicon, poly silicon, and the like), or an organic semiconductor. The active pattern ACT may include a source region, a drain region, and a channel region positioned between the source region and the drain region.

The metal oxide semiconductor may include a two-component compound ("$AB_x$"), a ternary compound ("$AB_xC_y$"), a four-component compound ("$AB_xC_yD_z$"), and the like containing indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and the like. For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), indium gallium zinc oxide ("IGZO"), and the like. These may be used alone or in combination with each other.

The first insulating layer IL1 may be disposed on the buffer layer BUF. The first insulating layer IL1 may sufficiently cover the active pattern ACT, and may have a substantially flat upper surface without creating a step around the active pattern ACT. Alternatively, the first insulating layer IL1 may cover the active pattern ACT and may be disposed along the profile of the active pattern ACT with a uniform thickness. For example, the first insulating layer IL1 may include an inorganic material such as silicon oxide ("$SiO_x$"), silicon nitride ("$SiN_x$"), silicon carbide ("$SiC_x$"), silicon oxynitride ("$SiO_xN_y$"), silicon oxycarbide ("$SiO_xC_y$"), and the like. These may be used alone or in combination with each other.

The gate electrode GAT may be disposed on the first insulating layer IL1. The gate electrode GAT may overlap the channel region of the active pattern ACT. The gate electrode GAT may include a metal, an alloy metal nitride, a conductive metal oxide, a transparent conductive material, and the like. Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), and the like. Examples of the conductive metal oxide may include indium tin oxide, indium zinc oxide, and the like. In addition, examples of the metal nitride may include aluminum nitride ("$AlN_x$"), tungsten nitride ("$WN_x$"), chromium nitride ("CrN$_x$"), and the like. These may be used alone or in combination with each other.

The second insulating layer IL2 may be disposed on the first insulating layer IL1. The second insulating layer IL2 may sufficiently cover the gate electrodes GAT, and may have a substantially flat upper surface without creating a step around the gate electrodes GAT. Alternatively, the second insulating layer IL2 may cover the gate electrode GAT and may be disposed along the profile of each gate electrode GAT with a uniform thickness. For example, the second insulating layer IL2 may include an inorganic material such as silicon oxide, silicon nitride, silicon carbide, silicon oxynitride, silicon oxycarbide, and the like. These may be used alone or in combination with each other.

The source electrode SE and the drain electrode DE may be disposed on the interlayer insulating layer ILD. The source electrode SE may be connected to the source region of the active pattern ACT through a contact hole passing through a first portion of the first insulating layer IL1 and the second insulating layer IL2. The drain electrode DE may be connected to the drain region of the active pattern ACT through a contact hole penetrating a second portion of the first insulating layer IL1 and the second insulating layer IL2. For example, each of the source electrode SE and the drain electrode DE may include a metal, an alloy, a metal nitride, a conductive metal oxide, a transparent conductive material, and the like. These may be used alone or in combination with each other.

Accordingly, the transistor TR including the active pattern ACT, the gate electrode GAT, the source electrode SE, and the drain electrode DE may be disposed on the substrate SUB in the display area DA.

The third insulating layer IL3 may be disposed on the second insulating layer IL2. The third insulating layer IL3 may sufficiently cover the source electrode SE and the drain electrode DE. The third insulating layer IL3 may include an inorganic material or an organic material. For example, the third insulating layer IL3 may include an organic material such as phenolic resin, polyacrylates resin, polyimides rein, polyamides resin, siloxane resin, epoxy resin, and the like. These may be used alone or in combination with each other.

The anode electrode ADE may be disposed on the third insulating layer IL3. The anode electrode ADE may be connected to the drain electrode DE of the transistor TR through a contact hole passing through the third insulating layer IL3. For example, the anode electrode ADE may include a metal, an alloy, a metal nitride, a conductive metal oxide, a transparent conductive material, and the like. These may be used alone or in combination with each other. In an embodiment, the anode electrode ADE may have a stacked structure including ITO/Ag/ITO.

The pixel defining layer PDL may be disposed on the third insulating layer IL3. The pixel defining layer PDL may cover both sides of the anode electrode ADE. The pixel defining layer PDL may include an organic material or an organic material. For example, the pixel defining layer PDL may include an organic material such as an epoxy resin, a siloxane resin, and the like. These may be used alone or in combination with each other. In another embodiment, the pixel defining layer PDL may further include a light blocking material containing a black pigment or black dye.

The light emitting layer EL may be disposed on the anode electrode ADE. The light emitting layer EL may include an organic material that emits light of a preset color. For example, the light emitting layer EL may include an organic material that emits red light, green light, or blue light.

The cathode electrode CTE may be disposed on the light emitting layer EL and the pixel defining layer PDL. For example, the cathode electrode CTE may include a metal, an alloy, a metal nitride, a conductive metal oxide, a transparent conductive material, and the like. These may be used alone or in combination with each other.

Accordingly, the light emitting element LED including the anode electrode ADE, the light emitting layer EL, and the cathode electrode CTE may be disposed in the display area DA on the substrate SUB.

The encapsulation layer ENC may be disposed on the cathode electrode CTE. The encapsulation layer ENC may prevent impurities, moisture, air, and the like from permeating the light emitting element LED from the outside. The encapsulation layer ENC may include at least one inorganic layer and at least one organic layer. For example, the inorganic layer may include silicon oxide, silicon nitride, silicon oxynitride, and the like. These may be used alone or in combination with each other. The organic layer may include a polymer cured material such as polyacrylate, and the like.

FIG. 4 is an enlarged plan view of an example of area A of FIG. 1.

Referring to FIGS. 1, 2, and 4, the display device DD according to an embodiment of the present disclosure may include the substrate SUB, the pad portion PDP, and first and second control signal lines CSL1 and CSL2, first and second connection lines CL1 and CL2, first, second, and third signal lines SL1, SL2 and SL3, first, second, and third transistors T1, T2 and T3, and the driving chip IC. Here, the driving chip IC may include the base portion BS facing the substrate SUB and the bump portion BP attached to the lower surface of the base portion BS.

In an embodiment, when viewed in a plan view, the pad portion PDP, the bump portion BP, the first, second, and third transistors T1, T2 and T3, the first and second connection lines CL1 and CL2, the first, second, and third signal lines SL1, SL2, and SL3, and the first and second control signal lines CSL1 and CSL2 may be symmetrically disposed with respect to a virtual line VL passing through a center of the driving chip IC. The virtual line VL may extend in the second direction DR2. Therefore, in the following description, only components positioned on a left side of the virtual line VL will be described.

The base portion BS may be divided into a first area 1A and a second area 2A. Each of the first area 1A and the second area 2A may extend along the first direction DR1. The first area A1 may be adjacent to the circuit board CB, and the second area A2 may be adjacent to the display area DA.

The pad portion PDP may include the plurality of input pads IPD and the plurality of output pads OPD. The bump portion BP may include the plurality of input bumps IBP and the plurality of output bump groups OBG. Here, each of the output bump groups OBG may include a first output bump OBP1, a second output bump OBP2, a detection bump DTB, and a dummy bump DB.

The input pads IPD may overlap the first area 1A of the driving chip IC. For example, the input pads IPD may have the same shape as each other. In addition, the input pads IPD may be repeatedly disposed along the first direction DR1.

The output pads OPD may overlap the second area 2A of the base portion BS. For example, the output pads OPD may have the same shape as each other. In addition, the output pads OPD may be repeatedly disposed along the first direction DR1 and the second direction DR2. In an embodiment, the output pads OPD may be repeatedly disposed along the first direction DR1 in a first row 1R, a second row 2R adjacent to the first row 1R, and a third row 3R adjacent to the second row 2R of the second area 2A. That is, the output pads OPD may be disposed along three rows in the second area 2A. Since the number of pixels PX controlled by the driving chip IC is large, the number of output pads OPD may be greater than the number of input pads IPD.

Each of the input bumps IBP may be disposed to correspond to each of the input pads IPD. That is, each of the input bumps IBP may at least partially overlap each of the input pads IPD. In other words, the input bumps IBP may overlap the first area 1A of the base portion BS and may be repeatedly disposed along the first direction DR1. Each of the input bumps IBP may be electrically connected to each of the input pads IPD. For example, the input bumps IBP may have the same shape as each other.

The second area 2A of the base portion BS may include dummy bump areas DMA, output bump areas OBA, and a data output area DTA. Each of the dummy bump areas DMA may be positioned on the right and left sides of the output bump area OBA. That is, each of the output bump areas OBA may be positioned between dummy bump regions DMA. In addition, a center of the data output area DTA may coincide with the virtual line VL.

Each of the first output bumps OBP1 may be disposed to correspond to each of the output pads OPD. That is, each of the first output bumps OBP1 may at least partially overlap each of the output pads OPD. In other words, the first output bumps OBP1 may be arranged in three rows in the second area 2A. Specifically, the first output bumps OBP1 may overlap each of the output bump areas OBA and may be repeatedly disposed along the first direction DR1 and the second direction DR2. In the output bump area OBA, each of the first output bumps OBP1 may be electrically connected to each of the output pads OPD.

When the display device DD is in a driving state, a control signal is applied to the at least one first output bump OBP1, and the control signal may be provided to the first control signal line CSL1 through the output pad OPD corresponding to at least one first output bump OBP1. For example, when the control signal is applied only to the first output bump OBP1 positioned in the first row 1R, the first output bump OBP1 positioned in the second row 2R and the third row 3R, respectively may be in a floating state. Unlike this, when the display device DD is in a non-driving state, a voltage may be applied to at least one first output bump OBPL.

Each of the second output bumps OBP2 may be disposed to correspond to each of the output pads OPD. That is, each of the second output bumps OBP2 may at least partially overlap each of the output pads OPD. In other words, the second output bumps OBP2 may be arranged in three rows in the second area 2A. Specifically, the second output bumps OBP2 may overlap the data output area DTA and may be repeatedly disposed along the first direction DR1 and the second direction DR2. In the data output area DTA, each of the second output bumps OBP2 may be electrically connected to each of the output pads OPD. The data voltage may be applied to the second output bump OBP2, and the data voltage may be provided to the fan-out line FL through the output pads OPD corresponding to the second output bumps OBP2.

Each of the dummy bumps DB may be disposed to correspond to each of the output pads OPD. That is, each of the dummy bumps DB may at least partially overlap each of the output pads OPD. In other words, the dummy bumps DB may be disposed in three rows in the second area 2A. In an embodiment, some dummy bumps DB among the dummy bumps DB may overlap the dummy bump area DMA and may repeatedly disposed along the first direction DR1 and the second direction DR2. Other dummy bumps DB among the dummy bumps DB may overlap the output bump area DMA and may be repeatedly disposed along the first direction DR1 and the second direction DR2. The dummy bumps DB may not be electrically connected to the output pads OPD corresponding to the dummy bumps DB.

The dummy bump DB may minimize a potential difference between adjacent first output bumps OBP1. In an embodiment, a high voltage may be applied to the dummy bump DB. In another embodiment, the dummy bump DB may be in a floating state. In another embodiment, a ground voltage may be applied to the dummy bump DB.

Each of the detection bumps DTB may be disposed to correspond to each of the output pads OPD. That is, each of the detection bumps DTB may at least partially overlap each of the output pads OPD. In other words, the detection bumps DTB may be arranged in three rows in the second area 2A. Specifically, the detection bumps DTB may overlap the output bump area DMA and may be repeatedly disposed along the first direction DR1 and the second direction DR2. In the output bump area DMA, each of the detection bumps DTB may be electrically connected to each of the output pads OPD.

In an embodiment, the output pad OPD corresponding to the detection bump DTB may be connected to the output pad OPD corresponding to the first output bump OBP1. Accordingly, each of the detection bumps DTB may be electrically connected to each of the first output bumps OPB1 positioned in the same row (e.g., the first row 1R, the second row 2R, or the third row 3R).

When the display device DD is in the driving state, the detection bump DTB may detect whether the driving chip IC is defective by measuring a waveform of the control signal applied to the first output bump OPB1. Unlike this, when the display device DD is in the non-driving state, the detection bump DTB whether the driving chip IC is defective by measuring a level of the voltage applied to the first output bump OPB1. The defect of the driving chip IC may mean lifting and corrosion of the driving chip IC in a high-temperature, high-humidity environment or a general user environment. A detailed description of this will be described later.

In an embodiment, only dummy bumps DB may be disposed in the dummy bump area DMA, and only second output bumps OBP2 may be disposed in the data output area DTA.

The first output bumps OBP1, the dummy bumps DB, and the detection bumps DTB may be disposed in the output bump area OBA. In an embodiment, in the output bump area OBA, the dummy bumps DB may be disposed in an n-th column, the detection bumps DTB may be disposed in an (n+1)-th column adjacent to the n-th column, and the first output bump OBP1 may be disposed in an (n+2)-th column adjacent to the (n+1)-th column (where the n is a natural number).

The fan-out lines FL may be respectively connected to the output pads OPD positioned in the first row 1R in the data output area DMA. Accordingly, the fan-out lines FL may be electrically connected to each of the second output bumps OBP2 positioned in the first row 1R in the data output area DMA.

The first control signal line CSL1 may be connected to each of the output pads OPD positioned in the first row 1R in the output bump area OBA. Accordingly, the first control signal line CSL1 may be electrically connected to each of the first output bumps OBP1 positioned in the first row 1R in the output bump area OBA.

The first connection line CL1 may be connected to each of the first control signal line CSL1 and the output pads OPD positioned in the second row 2R in the output bump area OBA. Accordingly, the first connection line CL1 may be electrically connected to each of the first control signal line CSL1 and the first output bumps OBP1 positioned in the second row 2R in the output bump area OBA.

The second connection line CL2 may be connected to each of the first control signal line CSL1 and the output pads OPD positioned in the third row 3R in the output bump area OBA. Accordingly, the second connection line CL2 may be electrically connected to each of the first control signal line CSL1 and the output pads OPD positioned in the third row 3R in the output bump area OBA.

That is, in the output bump area OBA, the first output bump OBP1 positioned in the first row 1R, the first output bump OBP1 positioned in the second row 2R, and the first output bump OBP1 positioned in the third row 3R may be connected in parallel through the first connection line CL1, the second connection line CL2, and the first control signal line CSL1.

The first transistor T1 may be disposed in the non-display area NDA on the substrate SUB. The first transistor T1 may include a first electrode, a second electrode, and a gate electrode. The first electrode of the first transistor T1 may be connected to the first control signal line CSLL. The second electrode of the first transistor T1 may be connected to the second electrode of the second transistor 72. The gate electrode of the first transistor T1 may be connected to the first signal line SL1. A first signal may be applied to the gate electrode of the first transistor T1 through the first signal line SL1.

The second transistor T2 may be disposed in the non-display area NDA on the substrate SUB. The second transistor T2 may include a first electrode, a second electrode, and a gate electrode. The first electrode of the second transistor T2 may be connected to the first connection line CL1. The second electrode of the second transistor T2 may be connected to the second electrode of the third transistor T3. The gate electrode of the second transistor 72 may be connected to the second signal line SL2. A second signal may be applied to the gate electrode of the second transistor T2 through the second signal line SL2.

The third transistor T3 may be disposed in the non-display area NDA on the substrate SUB. The third transistor T3 may include a first electrode, a second electrode, and a gate electrode. The first electrode of the third transistor T3 may be connected to the second connection line CL2. The second electrode of the third transistor T3 may be connected to the second electrode of the second transistor T2. The gate electrode of the third transistor T3 may be connected to the third signal line SL3. A third signal may be applied to the gate electrode of the third transistor T3 through the third signal line SL3.

In an embodiment, each of the first, second, and third transistors T1, T2, and T3 may be a switching transistor.

In an embodiment, the first control signal line CSL1, the second control signal line CSL2, the first connection line CL1, the second connection line CL2, the first signal line SL1, the signal line SL2, and the third signal line SL3 may be disposed on the same layer on the substrate SUB.

In the display device DD according to an embodiment of the present disclosure, all first output bumps OBP1 of the driving chip IC to which the control signal or the voltage is applied may be connected in parallel through the first and second connection lines CL1 and CL2 and a control signal line (e.g., the first control line CSL1 or the second control line CSL2). In addition, the detection bumps DTB electrically connected to the first output bumps OBP1 may detect whether the driving chip IC is defective by measuring the waveform of the control signal or the level of the voltage applied to the first output bumps OBP1. Accordingly, when a defect occurs in the driving chip IC, the time at which the defect occurs in the driving chip IC may be delayed.

Figure 5:
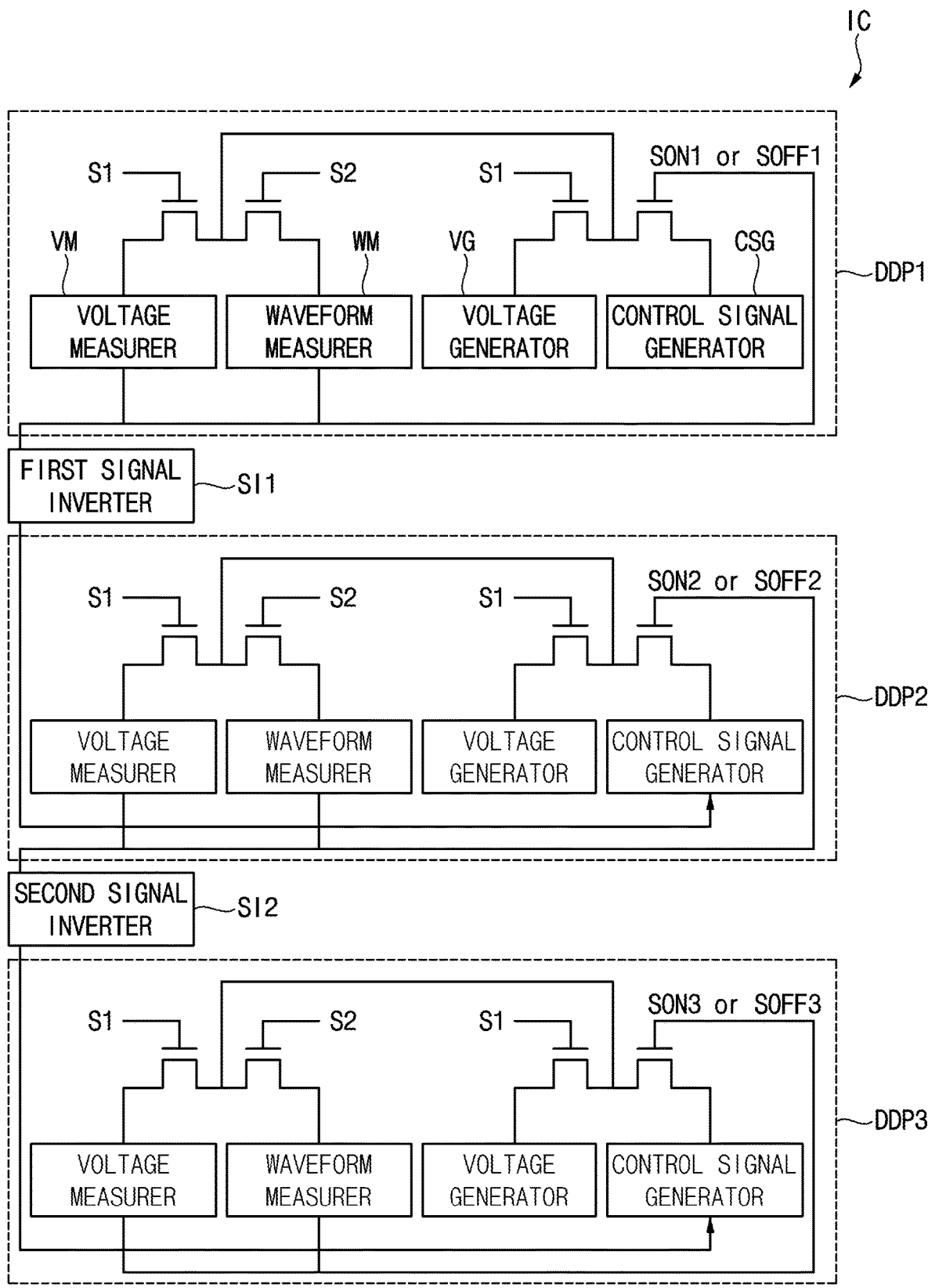
FIG. 5 is a block diagram of a driving chip for explaining a method of detecting a defect of the driving chip of FIGS. 1 and 4.
Figure 6:
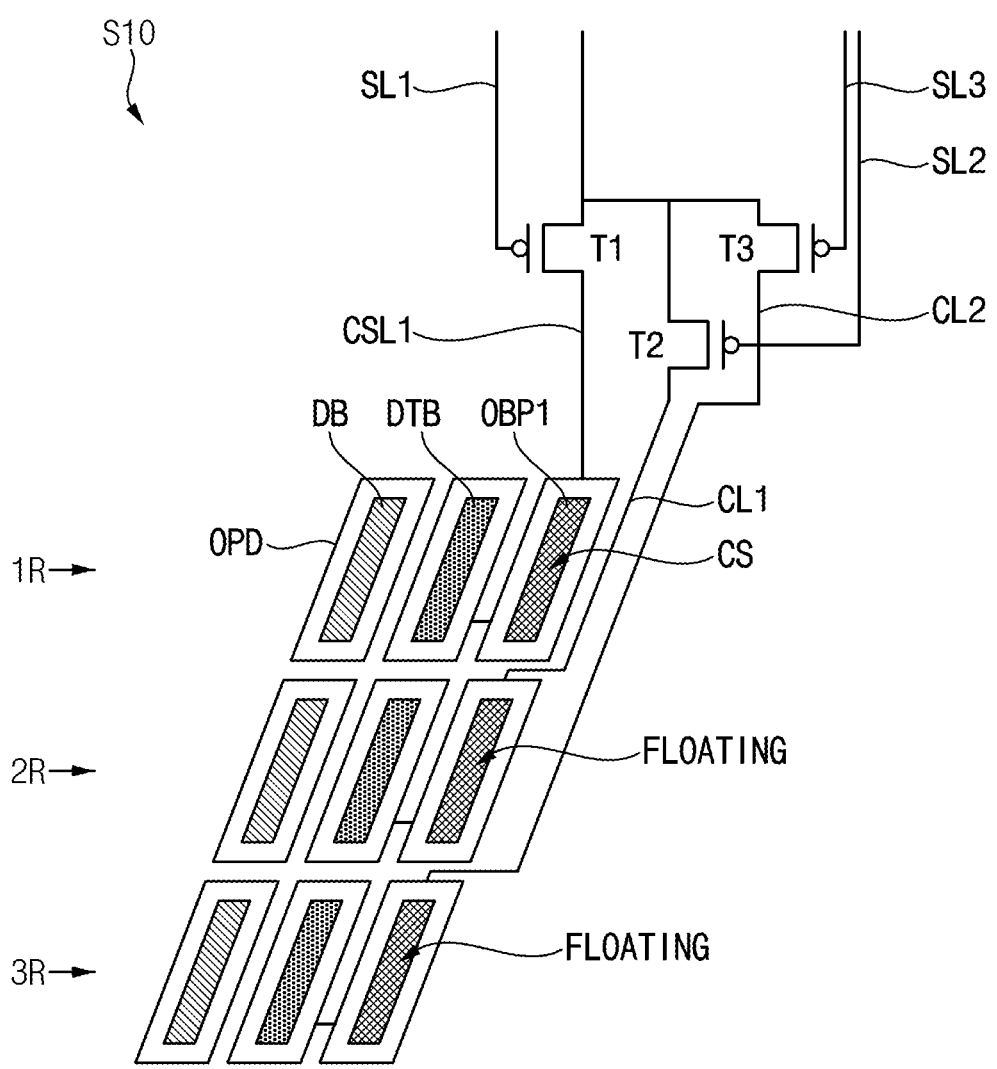
FIGS. 6, 7, and 8 are plan views for explaining an example of a method for detecting a defect in the driving chip of FIG. 5.
Figure 7:
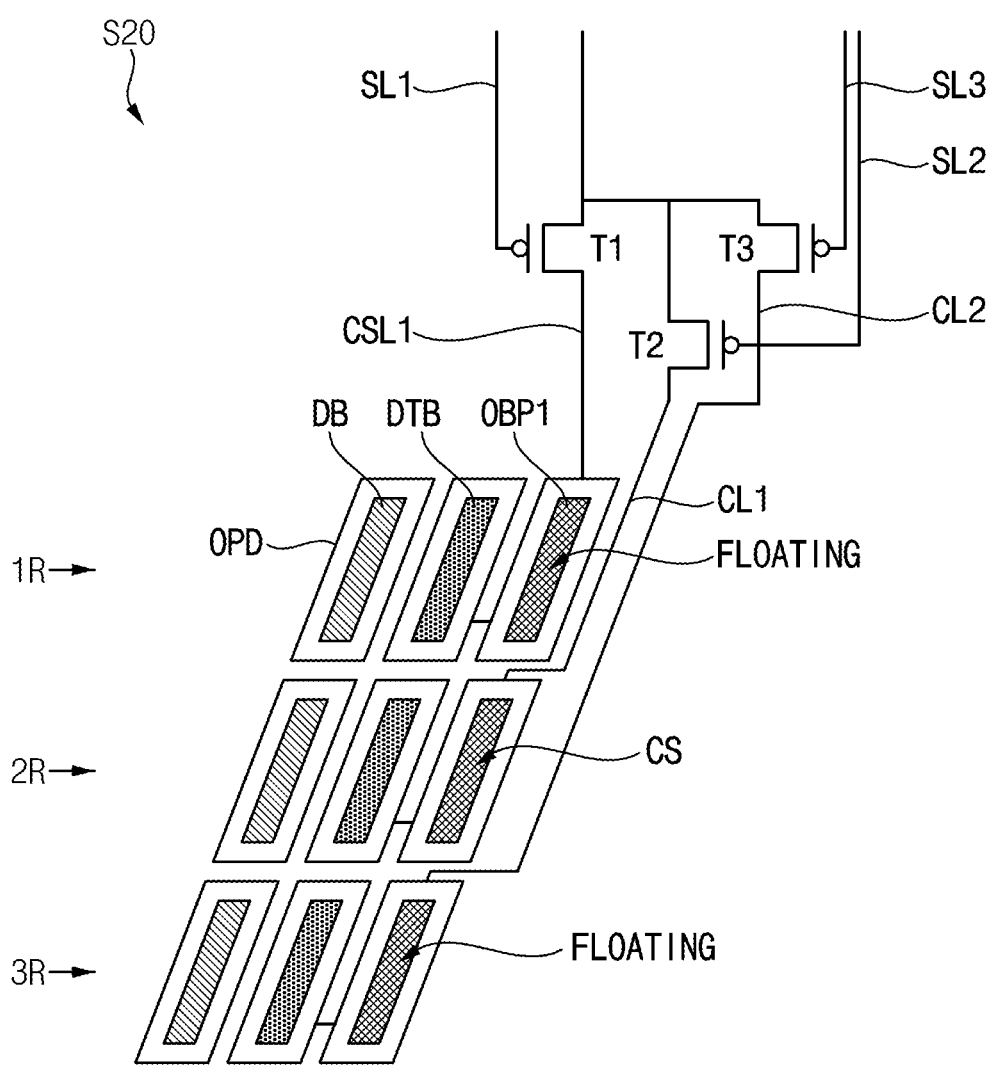
Figure 8:
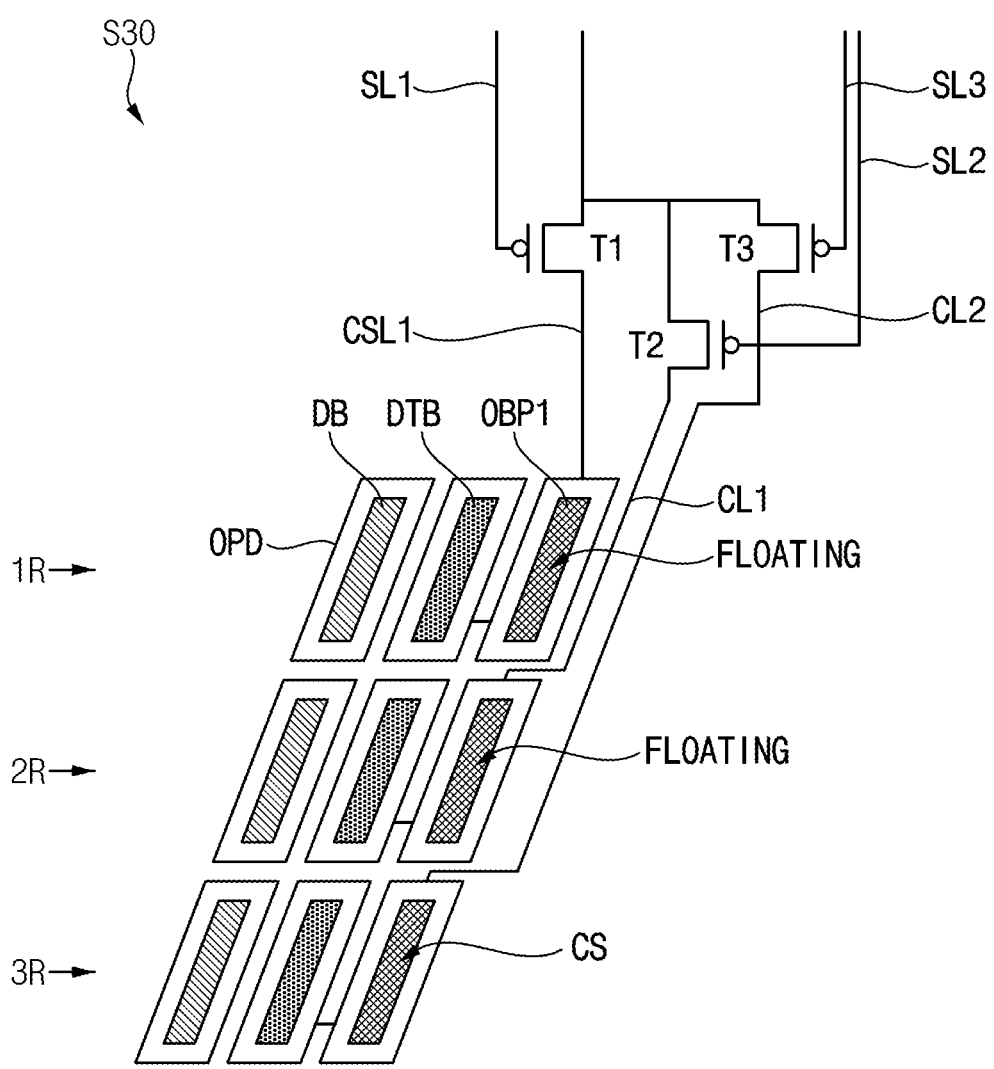
Figure 9:
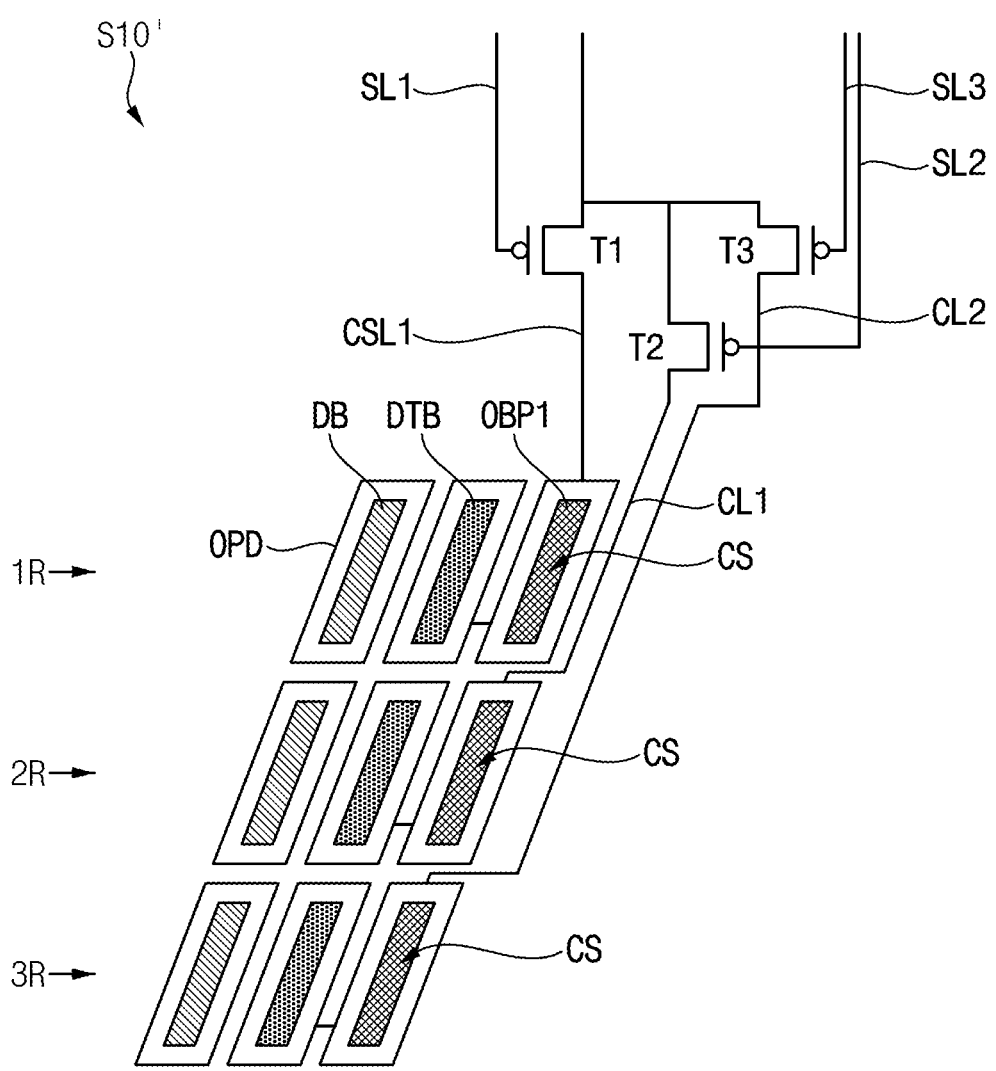
FIGS. 9, 10, and 11 are plan views for explaining another example of a method for detecting a defect in a driving chip of FIG. 5.
Figure 10:
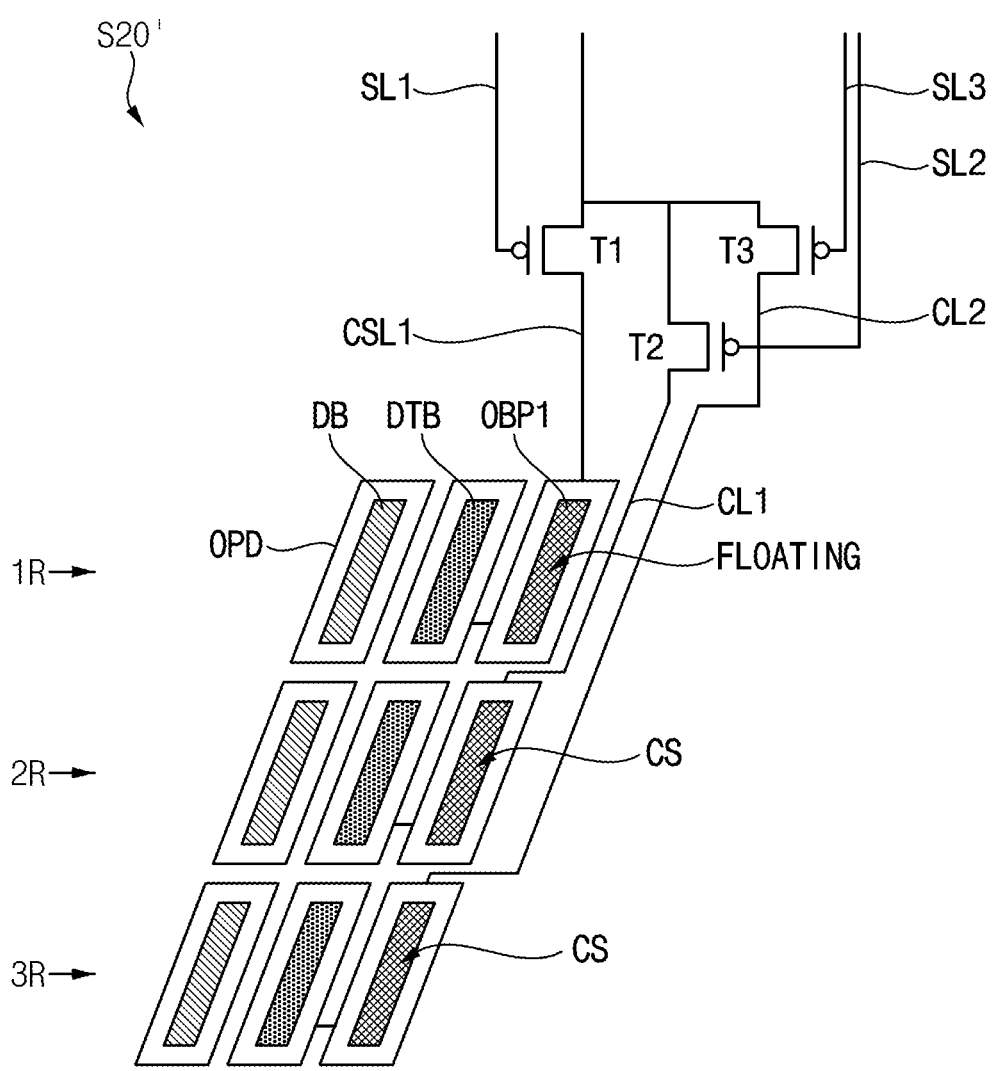
Figure 11:
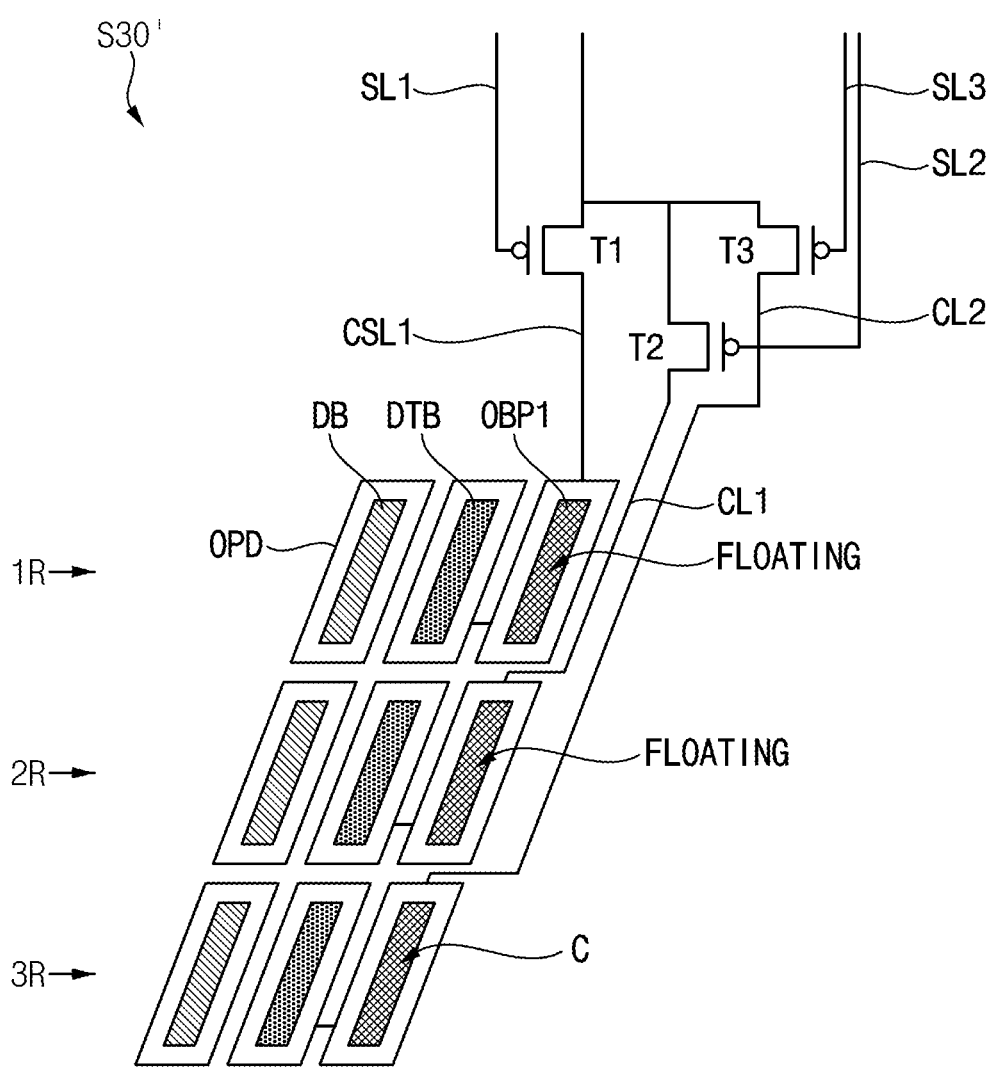

FIG. 5 is a block diagram of a driving chip for explaining a method of detecting a defect of the driving chip of FIGS. 1 and 4. FIGS. 6, 7, and 8 are plan views for explaining an example of a method for detecting a defect in the driving chip of FIG. 5. FIGS. 9, 10, and 11 are plan views for explaining another example of a method for detecting a defect in a driving chip of FIG. 5.

Referring to FIGS. 5, 6, 7, 8, 9, 10, and 11, the driving chip IC may include a first defect detector DDP1, a second defect detector DDP2, a third defect detector DDP3, a first signal inverter SI1, and a second signal inverter SI2. An inverter SI2 may be included. Each of the first, second, and third defect detector DDP1, DDP2, and DDP3 may include a control signal generator CSG, a voltage generator VG, a waveform measurer WM, and a voltage measurer VM. Here, each of the control signal generator CSG, the voltage generator VG, the waveform measurer WM, the voltage measurer VM, and the first and second signal inverters SI1 and SI2 may be a software component of the driving chip IC.

The first defect detector DDP1 may be a component for detecting a defect occurring in a portion of the driving chip IC corresponding to the first row 1R, the second defect detector DDP2 may be a component for detecting a defect occurring in a portion of the driving chip IC corresponding to the second row 2R, and the third defect detector DDP3 may be a component for detecting a defect occurring in a portion of the driving chip IC corresponding to the third row 3R.

The driving chip IC may detect whether or not the driving chip IC is defective through the control signal or the voltage applied to the first output bumps OBPL. First, a case in which the display device DD is in the driving state will be described as an example. When the display device DD is in the driving state, the control signal generator CSG may generate a control signal CS, and the voltage generator VG may not generate the voltage.

For example, as illustrated in FIG. 6, the control signal CS generated by the control signal generator CSG of the first defect detector DDP1 may be applied to the first output bump OBP1 positioned in the first row 1R and the first output bump OBP1 positioned in each of the second row 2R and the third row 3R may be in a floating state (S10). In this case, the first transistor T1 may be turned on by the first signal provided through the first signal line SL1, the second transistor T2 may be turned off by the second signal provided through the second signal line SL2, and the third transistor T3 may be turned off by the third signal provided through the third signal line SL3. In this case, the first signal may have a high level, and each of the second signal and the third signal may have a low level.

The control signal CS applied to the first output bump OBP1 positioned in the first row 1R may be applied to the detection bump DTB positioned in the first row 1R. Then, the waveform measurer WM of the first defect detector DDP1 may measure the waveform of the control signal CS provided to the detection bump DTB based on a second signal S2. For example, when the peak value of the control signal CS applied to the first output bump OBP1 versus the peak value of the control signal CS applied to the detection bump DTB is smaller than a preset value, a portion of the driving chip IC corresponding to the first row 1R may be determined to be defective. Alternatively, when the peak-to-peak interval of the control signal CS provided to the detection bump DTB is equal to or greater than a preset value, the portion of the driving chip IC corresponding to the first row 1R may be determined to be normal.

When the portion of the driving chip IC corresponding to the first row 1R is determined to be normal, the waveform measurer WM of the first defect detector DDP1 transmits a first on signal SON1 to the control signal generator CSG of the first defect detector DDP1, the control signal generator CSG of the first defect detector DDP1 may generate the control signal CS, and the above-described process may be repeated. If the portion of the driving chip IC corresponding to the first row 1R is determined to be defective, the waveform measurer WM of the first defect detector DDP1 may provide a first off signal SOFF1 to the first signal inverter SI1 and the control signal generator CSG of the second defect detector DDP2. The control signal generator CSG of the first defect detector DDP1 receiving the first off signal SOFF1 may not generate the control signal CS. That is, the first output bump OBP1 positioned in the first row 1R may be in a floating state. The first signal inverter SI1 may convert the first off signal SOFF1 into a second on signal SON2. The second on signal SON2 may be provided to the control signal generator CSG of the second defect detector DDP2.

If the portion of the driving chip IC corresponding to the first row 1R is determined to be defective, as illustrated in FIG. 7, the first output bumps OBP1 positioned in the first row 1R and the third row 3R may be in a floating state and the control signal CS generated by the control signal generator CSG of the second defect detector DDP2 based on the second on signal SON2 may be applied to the first output bump OBP1 positioned in the second row 2R (S20). In this case, the first transistor T1 may be turned off by the first signal provided through the first signal line SL1, the second transistor T2 may be turned on by the second signal through the second signal line SL2, and the third transistor T3 may be turned off by the third signal through the third signal line SL3. In this case, the second signal may have a high level, and each of the first signal and the third signal may have a low level.

The control signal CS applied to the first output bump OPB1 positioned in the second row 2R may be applied to the detection bump DTB positioned in the second row 2R. Next, the waveform measurer VM of the second defect detector unit DDP2 may measure the waveform of the control signal CS provided to the detection bump DTB based on the second signal S2.

When a portion of the driving chip IC corresponding to the second row 2R is determined to be normal, the waveform measurer VM of the second defect detector DDP2 may provide the second on signal SON2 to the control signal generator CSG of the second defect detector DDP2, the control signal generator CSG of the second defect detector DDP2 may generate the control signal CS, and the above-described process may be repeated. If the portion of the driving chip IC corresponding to the second row 2R is determined to be defective, the waveform measurer VM of the second defect detector DDP2 may provide a second off signal SOFF2 to the second signal inverter SI2 and the control signal generator CSG of the third defect detector DDP3. The control signal generator CSG of the second defect detector DDP2 receiving the second off signal SOFF2 may not generate the control signal CS. That is, the first output bump OPB1 positioned in the second row 2R may be in a floating state. The second signal inverter SI2 may convert the second off signal SOFF2 into a third on signal SON3. The third on signal SON3 may be provided to the control signal generator CSG of the third defect detector DDP3.

If the portion of the driving chip IC corresponding to the second row 2R is determined to be defective, as illustrated in FIG. 8, the first output bumps OBP1 positioned in the first row 1R and the second row 2R may be in a floating state, and the control signal CS generated by the control signal generator CSG of the third defect detector DDP3 based on the third on signal SON3 may be applied to the first output bump OPB1 positioned in the third row 3R (S30). In this case, the first transistor T1 may be turned off by the first signal provided through the first signal line SL1, the second transistor T2 may be turned off by the second signal provided through signal line SL2, and the third transistor T3 may be turned on by the third signal provided through the third signal line SL3. In this case, the third signal may have a high level, and each of the first signal and the second signal may have a low level.

The third defect detector DDP3 may detect whether the driving chip IC is defective in the same way as the first and second defect detector DDP1 and DDP2. Therefore, a description thereof will be omitted.

Finally, the control signal CS may be applied to the first output bumps OPB1 positioned in the row corresponding to the portion of the driving chip IC determined to be normal, and the control signal CS may be provided to a scan driver (or, a light emitting driver) through the first control signal line CSL1 (or, the second control signal line CSL2 of FIG. 4).

However, the present invention is not limited thereto, and the order in which the first output bumps OBP1 are floated and the order in which the control signal CS is applied to the first output bumps OBP1 may vary. For example, as illustrated in FIG. 9, the control signal CS may be applied to each of the first, second, and third rows 1R, 2R, and 3R (S10'). Here, if the portion of the driving chip IC corresponding to the first row 1R is determined to be defective, as illustrated in FIG. 10, the first output bump OBP1 positioned in the first row 1R may be floating state, the control signal CS may be applied to the first output bump OBP1 positioned in the second row 2R and the third row 3R (S20'). Here, if the portion of the driving chip IC corresponding to the second row 2R is determined to be defective, as illustrated in FIG. 11, the first output bump OBP1 positioned each of the first row 1R and the second row 2R may be in a floating state, and the control signal CS may be applied to the first output bump OBP1 positioned on the third row 3R (S30').

Hereinafter, a case in which the display device DD is in the non-driving state will be described as an example. When the display device DD is in the non-driving state, the control signal generator CSG does not generate the control signal CS, and the voltage generator VG may generate the voltage based on the first signal S1. The method of detecting the defect in the driving chip IC when the display device DD is in the non-driving state may be substantially the same as the method of detecting the defect in the driving chip IC when the display device DD is in the driving state except for detecting the defect of the driving chip IC by measuring the level of the voltage. Therefore, redundant descriptions will be omitted.

The voltage applied to the first output bump OBP1 positioned in the first row 1R may be applied to the detection bump DTB. Then, the voltage measurer VM of the first defect detector DDP1 may measure the level of the voltage applied to the detection bump DTB based on the first signal S1. For example, the voltage measurer VM determines that the voltage applied to the detection bump DTB is lower than the voltage applied to the first output bump OBP1 by a preset value, a portion of the driving chip IC corresponding to the first row 1R may be determined to be defective. The method of detecting the defect of the driving chip IC in each of the second defect detector DDP2 and the third defect detector DDP3 may be the same as the method of detecting the defect of the driving chip IC in the first defect detector DDP1

FIGS. 12, 13, 14, 15, 16, 17, and 18 are enlarged plan views of other examples of area A of FIG. 1. Hereinafter, descriptions overlapping with those described with reference to FIG. 4 will be omitted or simplified.

FIGS. 12, 13, 14, 15, 16, 17, and 18 do not illustrate switching transistors respectively connected to the lines (e.g., the first control signal line CSL1, the second control signal line CSL2, the first connection line CL1, the second connection line CL2, and a connection line CL), but the switching transistors may be connected to each of the lines. Therefore, a description thereof is omitted.

Figure 12:
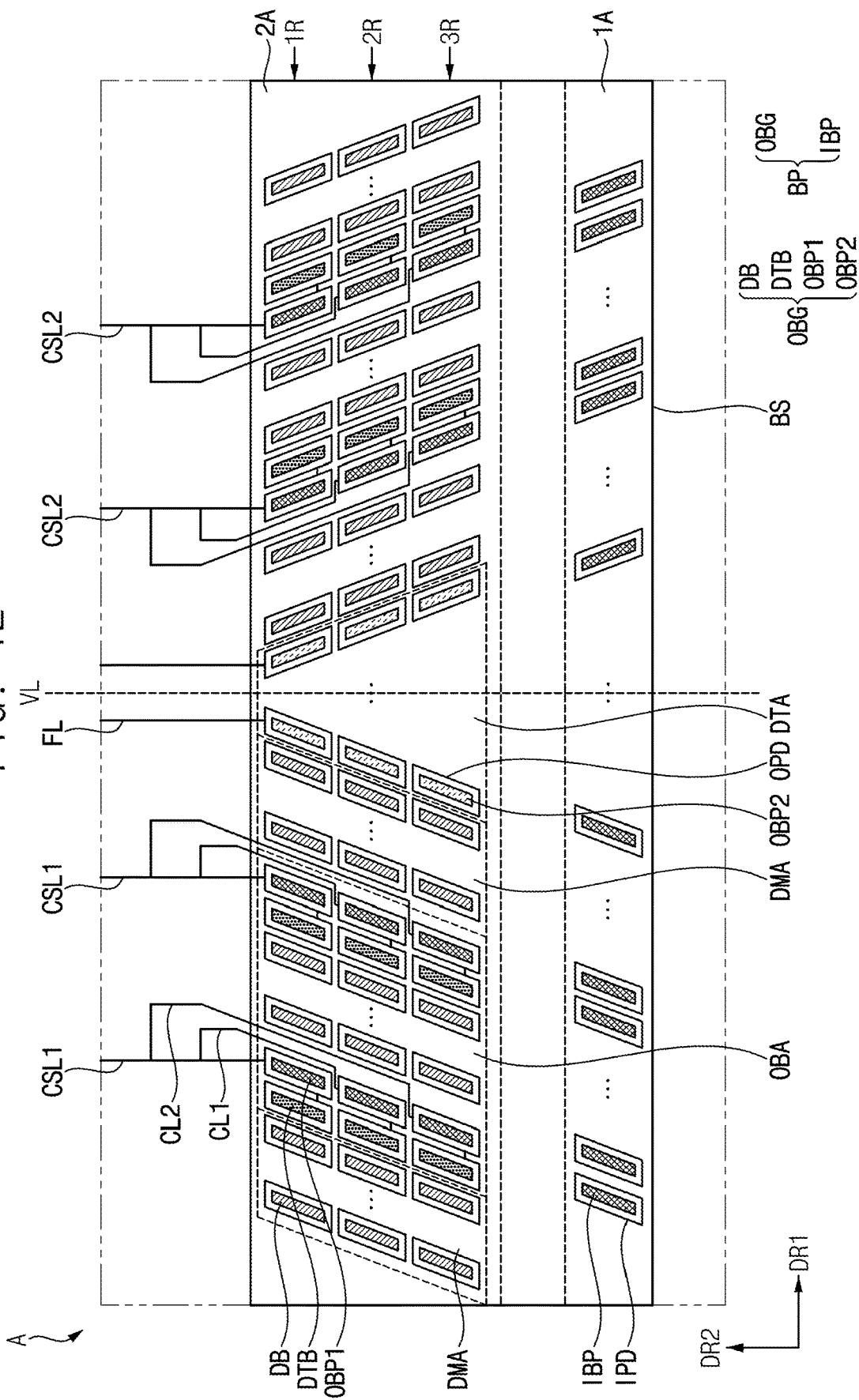
FIGS. 12, 13, 14, 15, 16, 17, and 18 are enlarged plan views of other examples of area A of FIG. 1.

Referring to FIG. 12, the first output bumps OBP1, the dummy bumps DB, and the detection bumps DTB may be disposed in the output bump area DMA.

In an embodiment, the number of dummy bumps DB disposed in the output bump area DMA illustrated in FIG. 12 may be greater than the number of dummy bumps DB disposed in the output bump area DMA illustrated in FIG. 4. That is, the number of dummy bumps DB positioned between the first output bumps OBP1 may be increased. In other words, the number of dummy bumps DB in the output bump area DMA may be greater than the number of first output bumps OBP1 and may be greater than the number of detection bumps DTB.

Figure 13:
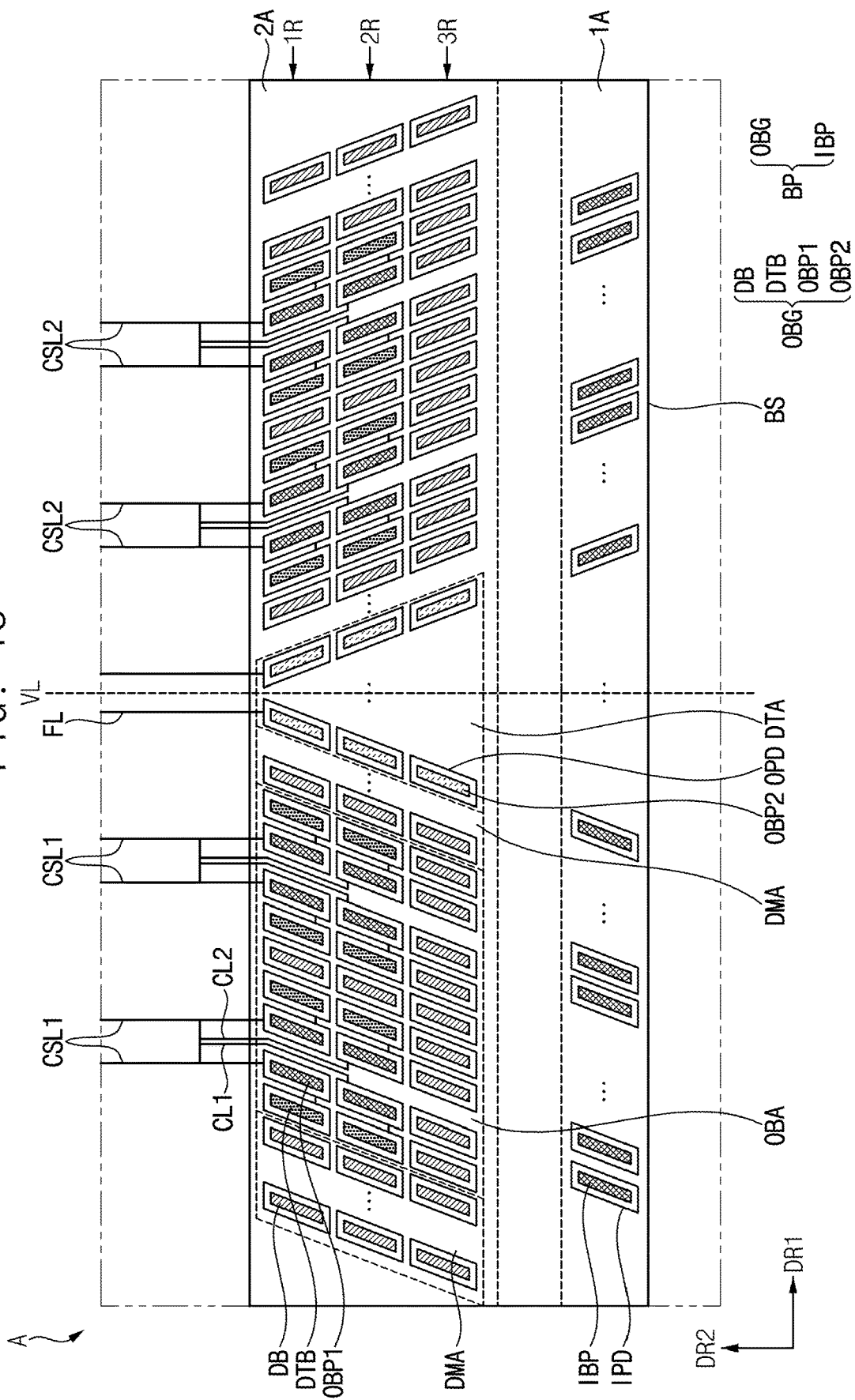

Referring to FIG. 13, the first output bumps OBP1, the dummy bumps DB and the detection bumps DTB may be disposed in the output bump area DMA. In an embodiment, in the output bump area DMA, the detection bumps DTB may be disposed in a (5n−4)-th column and a (5n−1)-th column of each of the first row 1R and the second row 2R. In the output bump area DMA, the dummy bumps DB may be disposed in a 5n-th column of each of the first row 1R and the second row 2R, and may be disposed in the third row 3R. In the output bump area DMA, the first output bumps OBP1 may be disposed in a (5n−3)-th column and a (5n−2)-th column of the first row 1R and the second row 2R (where the n is a natural number).

Each of the detection bumps DTB may be electrically connected to each of the first output bumps OBPL. In addition, the first output bumps OBP1 positioned in the first row 1R may be connected to the first control signal line CSL1 (or the second control signal line CSL2), and the second output bumps OBP2 positioned in the second row 1R may be connected to the first control signal line CSL1 through the first and second connection lines CL1 and CL2. That is, the first output bumps OBP1 may be connected in parallel through the first connection line CL1, the second connection line CL2, and the first control signal line CSL1 (or the second control signal line CSL2).

Figure 14:
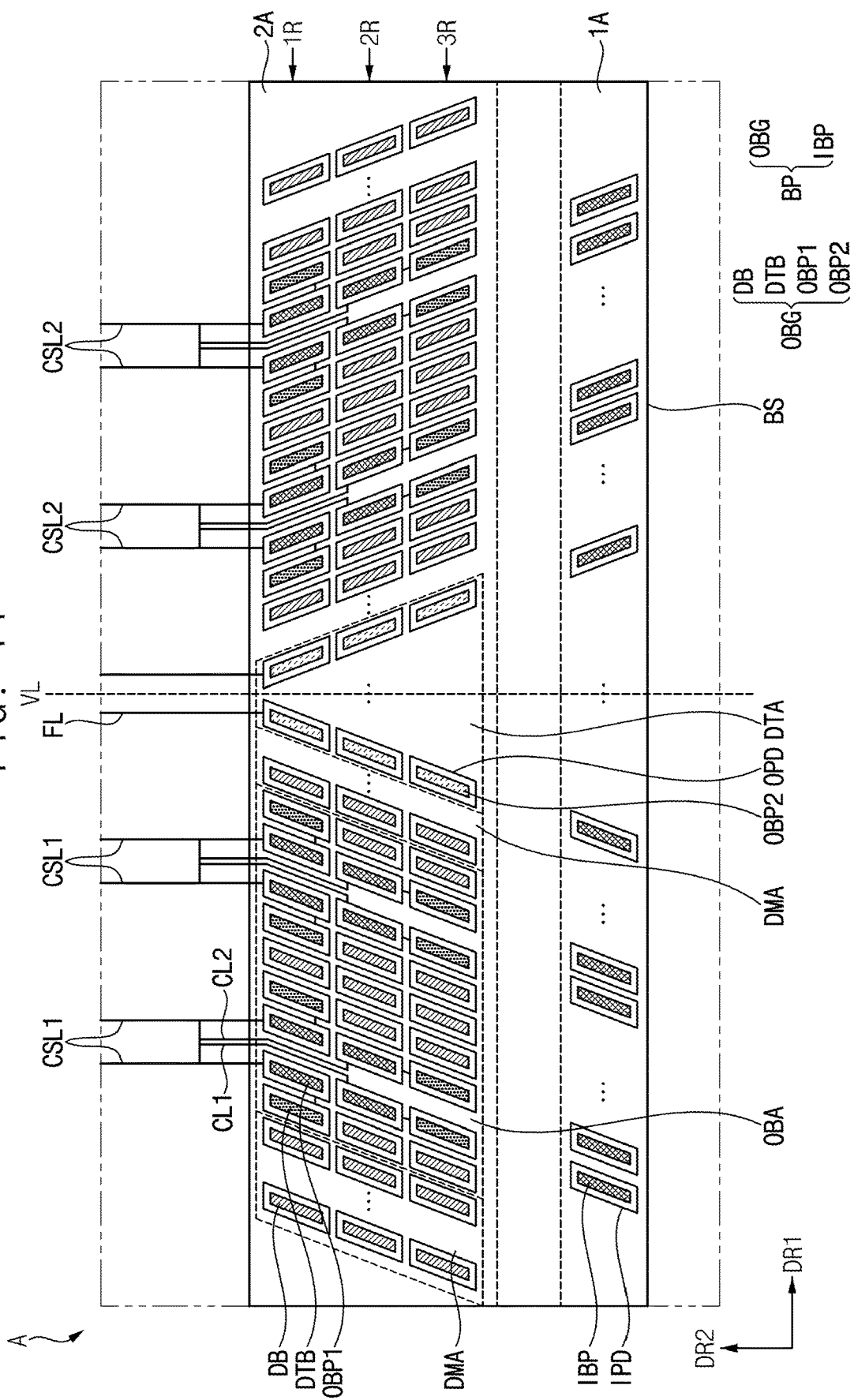
Figure 15:
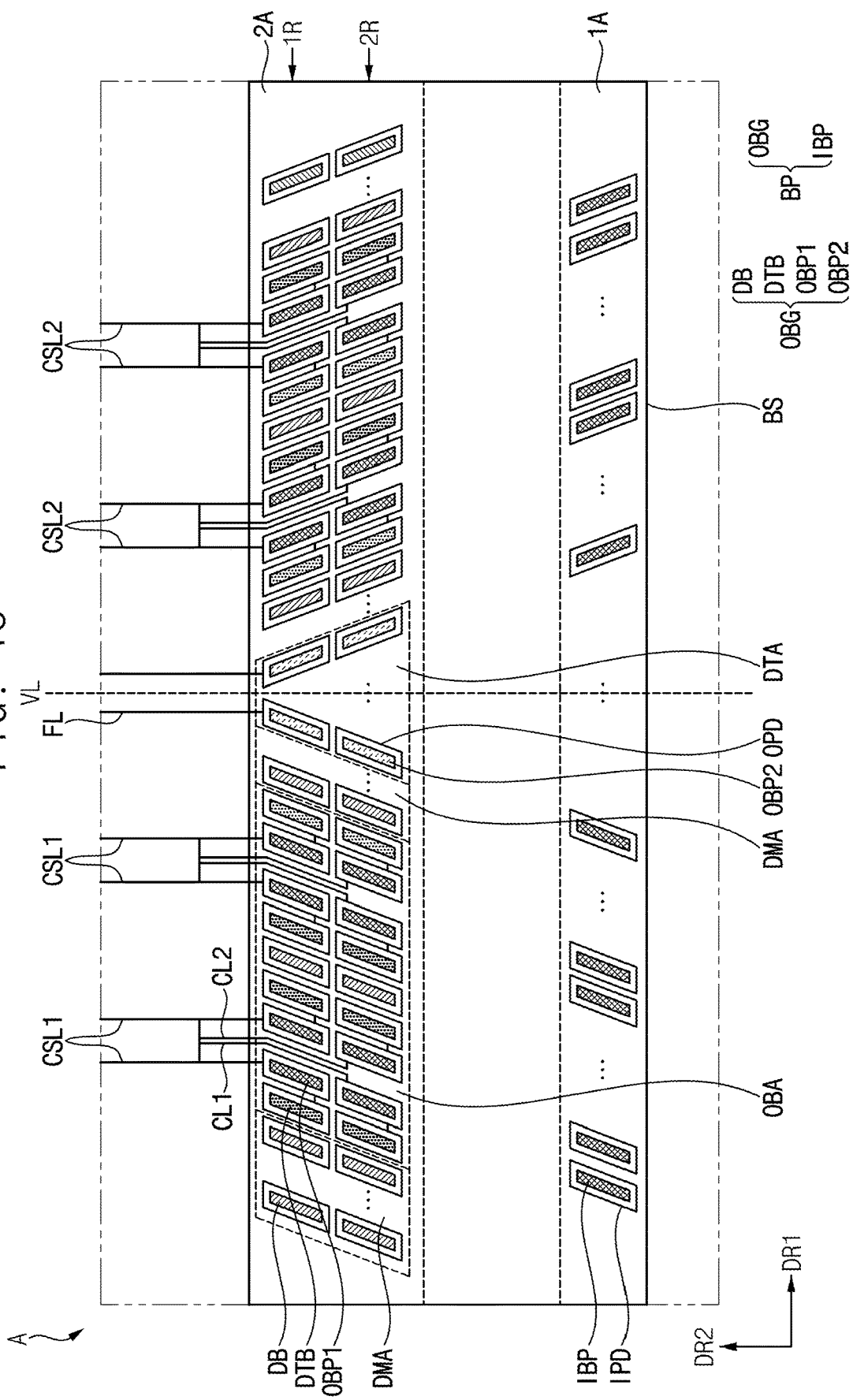
Figure 16:
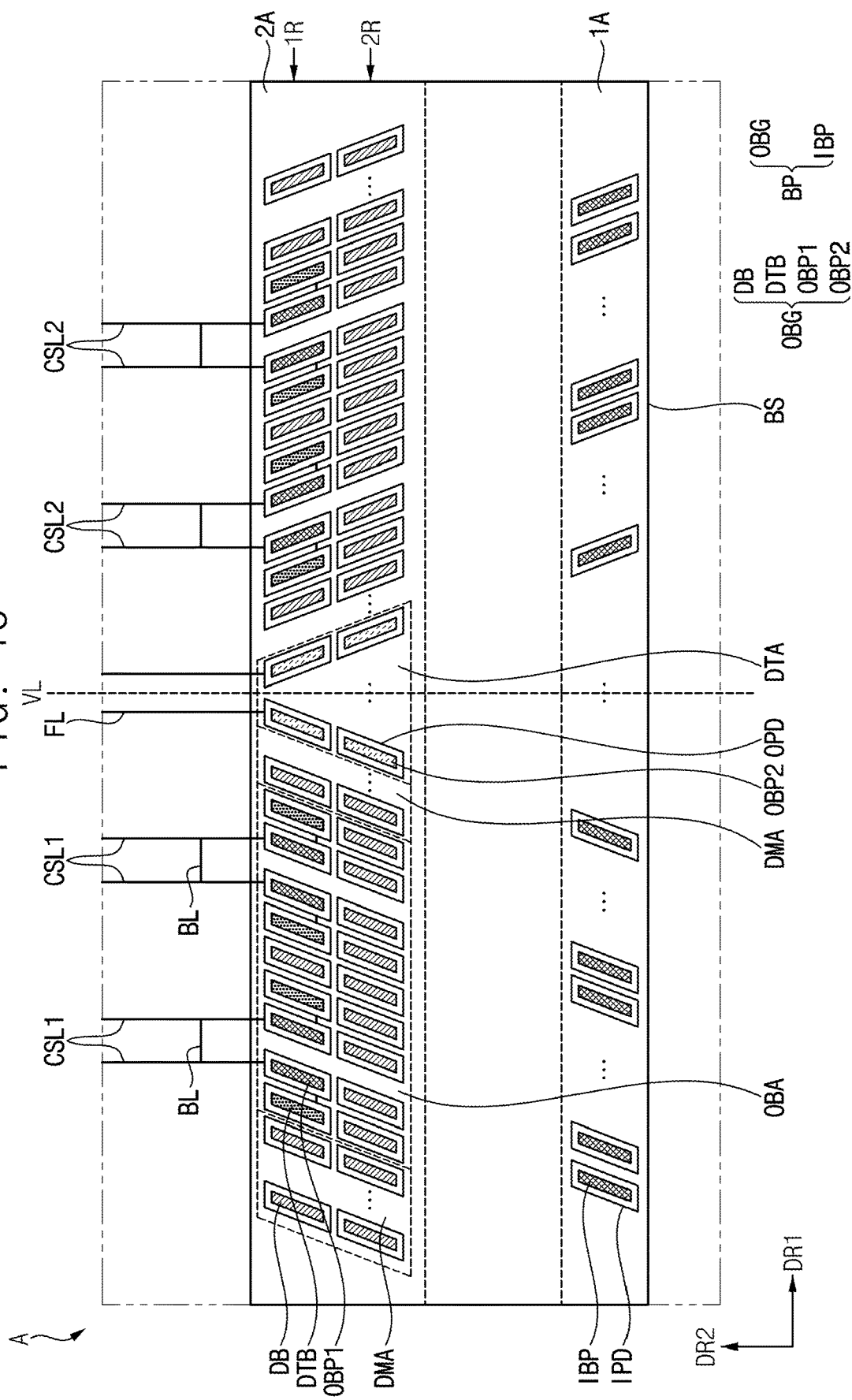
Figure 17:
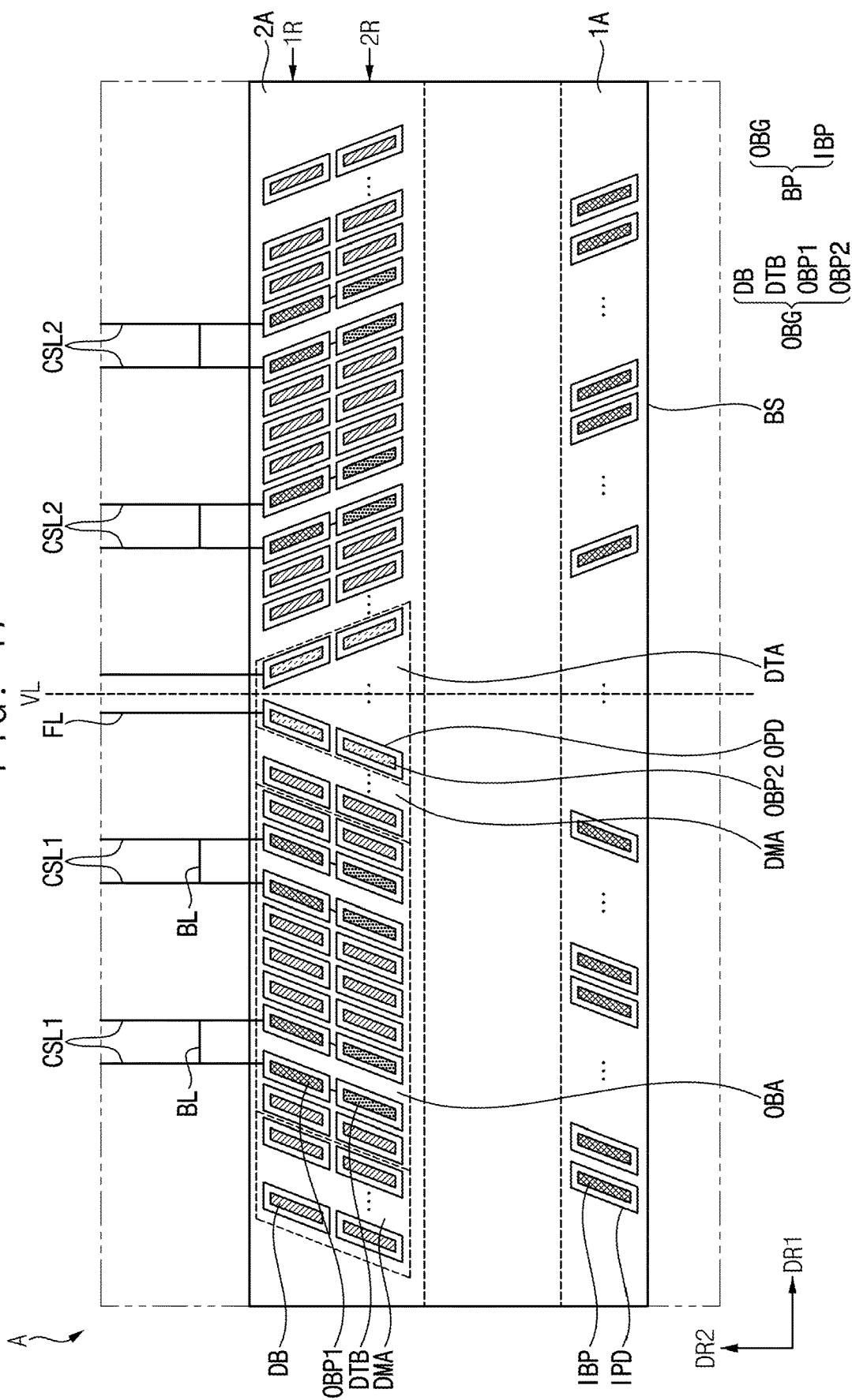
Figure 18:
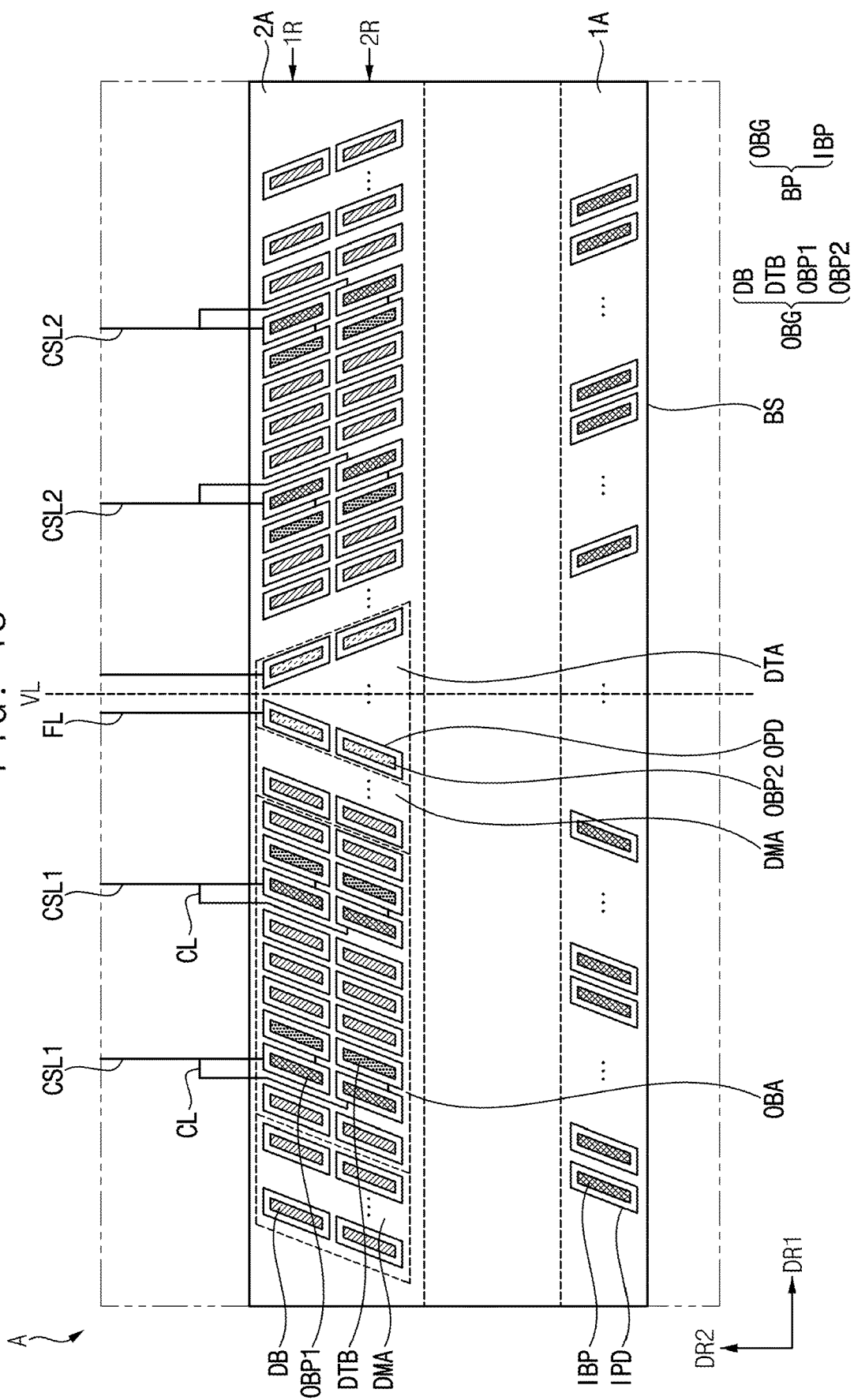

Referring to FIG. 14, the first output bumps OBP1, the dummy bumps DB, and the detection bumps DTB may be disposed in the output bump area DMA. In an embodiment, in the output bump area DMA, the detection bumps DTB may be disposed in a (5n−4)-th column and a (5n−1)-th column of the first row 1R, and a (5n−3)-th column and a (5n−2)-th column of the third row 3R. In the output bump area DMA, the dummy bumps DB may be disposed in a 5n-th column of the first row 1R, and the (5n−4)-th column, the (5n−1)-th column, and the 5n-th column of each of the second row 2R and the third row 3R. In the output bump area DMA, the first output bumps OBP1 may be disposed in the (5n−3)-th column and the (5n−2)-th column of each of the first row 1R and the second row 2R (where the n is a natural number).

Each of the detection bumps DTB may be electrically connected to each of the first output bumps OBPL. In addition, the first output bumps OBP1 positioned in the first row 1R may be connected to the first control signal line CSL1 (or the second control signal line CSL2), the first output bumps OBP1 positioned in the second row 2R may be connected to the first control signal line CSL1 through the first and second connection lines CL1 and CL2. That is, the first output bumps OBP1 may be connected in parallel through the first connection line CL1, the second connection line CL2, and the first control signal line CSL1 (or the second control signal line CSL2).

Referring to FIGS. 15, 16, 17 and 18, the output pads OPD may be disposed only in the first row 1R and the second row 2R. In addition, the first output bump OBP1, the second output bump OBP2, the dummy bump DB, and the detection bump DTB of each of the output bump groups OBG may disposed only in the first row 1R and the second row 2R. That is, the first output bump OBP1, the second output bump OBP2, the dummy bump DB, and the detection bump DTB may be disposed in only two rows.

Referring back to FIG. 15, the first output bumps OBP1, the dummy bumps DB, and the detection bumps DTB may be disposed in the output bump area DMA. In an embodiment, in the output bump area DMA, the detection bumps DTB may be disposed in a (5n−4)-th column and a (5n−1)-th column of each of the first row 1R and the second row 2R. In the output bump area DMA, the dummy bumps DB may be arranged in a 5n-th column of each of the first row 1R and the second row 2R. In the output bump area DMA, the first output bumps OBP1 may be disposed in a (5n−3)-th column and a (5n−2)-th column of each of the first row 1R and the second row 2R (where the n is a natural number).

Each of the detection bumps DTB may be electrically connected to each of the first output bumps OBPL. In addition, the first output bumps OBP1 positioned in the first row 1R may be connected to the first control signal line CSL1 and the first output bumps OBP1 positioned in the second row 2R may be connected to the first control signal line CSL1 through the first and second connection lines CL1 and CL2. That is, the first output bumps OBP1 may be connected in parallel through the first connection line CL1, the second connection line CL2, and the first control signal line CSL1 (or the second control signal line CSL2).

Referring back to FIG. 16, the first output bumps OBP1, the dummy bumps DB, and the detection bumps DTB may be disposed in the output bump area DMA. In an embodiment, in the output bump area DMA, the detection bumps DTB may be disposed in a (5n−4)-th column and a (5n−1)-th column of the first row 1R. In the output bump area DMA, the dummy bumps DB may be disposed in a 5n-th column of the first row 1R and may be disposed in the second row 2R. In the output bump area DMA, the first output bumps OBP1 may be disposed in a (5n−3)-th column and a (5n−2)-th column of the first row 1R (where the n is a natural number).

Each of the detection bumps DTB may be electrically connected to each of the first output bumps OBPL. In addition, the first control signal line CSL1 (or the second control signal line CSL2) may be electrically connected to each of the first output bumps OBP1, and adjacent first control signal lines CSL1 may be connected through a bridge line BL. That is, the first output bumps OBP1 may be connected in parallel through the first control signal line SL1 and the bridge line BL.

Referring back to FIG. 17, the first output bumps OBP1, the dummy bumps DB, and the detection bumps DTB may be disposed in the output bump area DMA. In an embodiment, in the output bump area DMA, the detection bumps DTB may be disposed in a (5n−3)-th column and a (5n−2)-th column of the second row 2R. In the output bump area DMA, the dummy bumps DB may be disposed in a (5n−4)-th column, a (5n−1)-th column, and a 5n-th column of each of the first row 1R and the second row 2R. In the output bump area DMA, the first output bumps OBP1 may be disposed in a (5n−3)-th column and a (5n−2)-th column of the second row 2R (where the n is a natural number).

Each of the detection bumps DTB may be electrically connected to each of the first output bumps OBP1. In addition, the first control signal line CSL1 (or second control signal line CSL2) may be electrically connected to each of the first output bumps OBP1, and adjacent first control signal lines CSL1 may be connected through the bridge line BL. That is, the first output bumps OBP1 may be connected in parallel through the first control signal line CSL1 (or the second control signal line CSL2) and the bridge line BL.

Referring back to FIG. 18, the first output bumps OBP1, the dummy bumps DB, and the detection bumps DTB may be disposed in the output bump area DMA. In an embodiment, in the output bump area DMA, the detection bumps DTB may be disposed in a (5n−2)-th column of each of the first row 1R and the second row 2R. In the output bump area DMA, the dummy bumps DB may be disposed in a (5n−4)-th column, a (5n−1)-th column, and a 5n-th column of each of the first row 1R and the second row 2R. In the output bump area DMA, the first output bumps OBP1 may be disposed in a (5n−3)-th column of each of the first row 1R and the second row 2R (where the n is a natural number).

Each of the detection bumps DTB may be electrically connected to each of the first output bumps OBPL. In addition, the first output bumps OBP1 positioned in the first row 1R may be electrically connected to the first control signal line CSL1 (or the second control signal line CSL2) and the first output bumps OBP1 positioned in the second row 2R may be electrically connected to the first control signal line CSL1 (or the second control signal line CSL2) through the connection line CL. That is, the first output bumps OBP1 may be connected in parallel through the connection line CL and the first control signal line CSL1 (or the second control signal line CSL2).

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope and spirit of the appended claims.

What is claimed is:

1. A display device comprising:
   a substrate including a display area and a non-display area positioned around the display area and including a pad area adjacent to one side of the display area;
   a light emitting element disposed in the display area on the substrate;
   a pad portion disposed in the pad area on the substrate and including a plurality of output pads;
   a driving chip including:
      a base portion facing the substrate, overlapping the pad area, and including dummy bump areas, an output bump area positioned between the dummy bump areas, and a data output area positioned between the dummy bump areas;
      a plurality of dummy bumps attached to a lower surface of the base portion and overlapping the dummy bump areas and the output bump area;
      a plurality of output bumps attached to the lower surface of the base portion, overlapping the output bump area, and connected in parallel to each other through transistors; and
      a plurality of detection bumps attached to the lower surface of the base portion, each of the detection bumps is electrically connected to an output bump from among the output bumps, and overlapping the output bump area; and
   a control signal line electrically connected through the transistors to the output bumps.

2. The display device of claim 1, wherein the control signal line is electrically connected to the output bump positioned in a first row,
   further comprising:
   a first connection line electrically connecting to the output bump positioned in a second row; and
   a second connection line electrically connecting to the output bump positioned in a third row.

3. The display device of claim 2, wherein the transistors include:
   a first transistor disposed in the non-display area and connected to the control signal line;
   a second transistor disposed in the non-display area and connected to the first connection line; and
   a third transistor disposed in the non-display area and connected to the second connection line.

4. The display device of claim 3, wherein each of the first, second, and third transistors is switching transistor.

5. The display device of claim 2, wherein the control signal line, the first connection line, and the second connection line are disposed on a same layer.

6. The display device of claim 1, wherein, in the output bump area,
   the dummy bumps are disposed in a n-th column (where, the n is a natural number),
   the detection bumps are disposed in an (n+1)-th column adjacent to the n-th column, and
   the output bumps are disposed in an (n+2)-th column adjacent to the (n+1)-th column.

7. The display device of claim 6, wherein the dummy bumps, the detection bumps, and the output bumps are disposed in three rows.

8. The display device of claim 1, wherein the number of the dummy bumps in the output bump area is greater than the number of the detection bumps and greater than the number of the first output bumps.

9. The display device of claim 1, wherein in the output bump area, the detection bumps are disposed in a (5n−4)-th column and a (5n−1)-th column of each of a first row and a second row adjacent to the first row (where the n is a natural number),
the dummy bumps are disposed in a 5n-th column of each of the first row and the second row and a third row adjacent to the second row, and
the output bumps are disposed in a (5n−3)-th column and in a (5n−2)-th column of each of the first row and the second row.

10. The display device of claim 1, wherein in the output bump area, the detection bumps are disposed in a (5n−4)-th column and a (5n−1)-th column of a first row and a (5n−3)-th column and a (5n−2)-th column of a third row (where the n is a natural number),
the dummy bumps are disposed in a 5n-th column of the first row, a (5n−4)-th column, a (5n−1)-th column, and a 5n-th column of each of a second row adjacent to the first row and the third row, and
the output bumps are disposed in a (5n−3)-th column and a (5n−2)-th column of each of the first row and the second row.

11. The display device of claim 1, wherein in the output bump area, the detection bumps are disposed in a (5n−4)-th column and a (5n−1)-th column of each of a first row and a second row adjacent to the first row (where the n is a natural number),
the dummy bumps are disposed in a 5n-th column of each of the first row and the second row, and
the output bumps are disposed in a (5n−3)-th column and a (5n−2)-th column of each of the first row and the second row.

12. The display device of claim 1, wherein in the output bump area, the detection bumps are disposed in a (5n−4)-th column and a (5n−1)-th column of a first row (where the n is a natural number),
the dummy bumps are disposed in a 5n-th column and a second row adjacent to the first row, and
the output bumps are disposed in a (5n−3)-th column and a (5n−2)-th column of first row.

13. The display device of claim 1, wherein in the output bump area, the detection bumps are disposed in a (5n−3)-th column and a (5n−2)-th column of a second row (where the n is a natural number),
the dummy bumps are disposed in a (5n−4)-th column, a (5n−1)-th column, and a 5n-th column of each of a first row adjacent to the second row and the second row, and
the output bumps are disposed in a (5n−3)-th column and a (5n−2)-th column of the second row.

14. The display device of claim 1, wherein in the output bump area, the detection bumps are disposed in a (5n−2)-th column of each of a first row and a second row adjacent to the first row,
the dummy bumps are disposed in a (5n−4)-th column, a (5n−1)-th column, and a 5n-th column of each of the first row and the second row, and
the output bumps are disposed in a (5n−3)-th column of each of the first row and the second row.

15. The display device of claim 1, wherein a high voltage is applied to each of the dummy bumps.

16. The display device of claim 1, wherein each of the dummy bumps is in a floating state, or a ground voltage is applied to each of the dummy bumps.

17. The display device of claim 1, further comprising:
a plurality of second output bumps attached to the lower surface of the base portion, overlapping the data output area, and to which a data voltage is applied.

18. The display device of claim 17, further comprising:
a fan-out line electrically connected to each of the second output bumps and providing the data voltage to the light emitting element.

19. The display device of claim 1, wherein a control signal is applied to some output bumps among the output bumps, and other output bumps among the output bumps are in a floating state.

20. The display device of claim 19, wherein the detection pads measure a waveform of the control signal applied to the output bumps.

21. The display device of claim 1, wherein a voltage is applied to some output bumps among the output bumps, and other output bumps among the output bumps are in a floating state.

22. The display device of claim 21, wherein the detection pads measure a level of the voltage applied to the first output pads.

23. The display device of claim 1, wherein each of the first output bumps, the detection bumps and the dummy bumps is disposed to correspond to each of the output pads.

24. A display device comprising:
a substrate including a display area and a pad area;
a light emitting element disposed in the display area on the substrate;
a pad portion disposed in the pad area on the substrate and including a plurality of output pads;
a driving chip including:
a base portion facing the substrate and overlapping the pad area;
a plurality of output bumps attached to a lower surface of the base portion, connected in parallel to each other through transistors, and to which a control signal or a voltage is applied to some of the output bumps; and
a plurality of detection bumps attached to the lower surface of the base portion, each of the detection bumps is electrically connected to an output bump from among the output bumps, and at least one of the detection bumps measures a waveform of the control signal or a level of the voltage; and
a control signal line electrically connected to the first output bumps through the transistors.

25. The display device of claim 24, wherein the control signal line is electrically connected to the output bump positioned in a first row,
further comprising:
a first connection line electrically connecting the output bump positioned in a second row adjacent to the first row; and
a second connection line electrically connecting the output bump positioned in a third row adjacent to the second row.

26. The display device of claim 24, wherein each of the output bumps is disposed to correspond to each of the output pads, and each of the detection bumps is disposed to correspond to each of the output pads.

* * * * *